(12) United States Patent
Choi et al.

(10) Patent No.: US 11,721,604 B2
(45) Date of Patent: Aug. 8, 2023

(54) SEMICONDUCTOR PACKAGE

(71) Applicant: SAMSUNG ELECTRONICS CO., LTD., Suwon-si (KR)

(72) Inventors: Dongjoo Choi, Seoul (KR); Seungduk Baek, Uiwang-si (KR); Youngdeuk Kim, Hwaseong-si (KR)

(73) Assignee: SAMSUNG ELECTRONICS CO., LTD.

(*) Notice: Subject to any disclaimer, the term of this patent is extended or adjusted under 35 U.S.C. 154(b) by 305 days.

(21) Appl. No.: 16/953,745

(22) Filed: Nov. 20, 2020

(65) Prior Publication Data

US 2021/0343616 A1    Nov. 4, 2021

(30) Foreign Application Priority Data

May 4, 2020   (KR) .................. 10-2020-0053382

(51) Int. Cl.
| | |
|---|---|
| *H01L 29/40* | (2006.01) |
| *H01L 25/065* | (2023.01) |
| *H01L 23/532* | (2006.01) |
| *H01L 23/31* | (2006.01) |
| *H01L 23/367* | (2006.01) |
| *H01L 23/522* | (2006.01) |

(52) U.S. Cl.
CPC ........ *H01L 23/367* (2013.01); *H01L 23/5226* (2013.01); *H01L 25/0657* (2013.01); *H01L 2225/06513* (2013.01); *H01L 2225/06589* (2013.01)

(58) Field of Classification Search
CPC . H01L 2225/06513; H01L 2224/16145; H01L 25/0657; H01L 2225/06541; H01L 2225/06517; H01L 24/81
See application file for complete search history.

(56) References Cited

U.S. PATENT DOCUMENTS

| | | |
|---|---|---|
| 6,710,443 B1 | 3/2004 | Rost et al. |
| 8,164,186 B2 | 4/2012 | Watanabe et al. |
| 8,933,540 B2 | 1/2015 | Daubenspeck et al. |

(Continued)

FOREIGN PATENT DOCUMENTS

| | | |
|---|---|---|
| KR | 10-2016-0120481 A | 10/2016 |
| KR | 10-2018-0069636 A | 6/2018 |

*Primary Examiner* — Anthony Ho
*Assistant Examiner* — David J Goodwin
(74) *Attorney, Agent, or Firm* — Fish & Richardson P.C.

(57) ABSTRACT

Provided is a semiconductor package including a lower semiconductor chip including a lower semiconductor substrate, a rear surface protecting layer covering a non-active surface of the lower semiconductor substrate, a plurality of lower via electrodes, and a plurality of rear surface signal pads and a plurality of rear surface thermal pads arranged on the rear surface protecting layer; an upper semiconductor chip including an upper semiconductor substrate, a wiring structure on an active surface of the upper semiconductor substrate, a front surface protecting layer that covers the wiring structure and has a plurality of front surface openings, and a plurality of signal vias and a plurality of thermal vias that fill the front surface openings; and a plurality of signal bumps connecting between the rear surface signal pads and the signal vias and a plurality of thermal bumps connecting between the rear surface thermal pads and the thermal vias.

20 Claims, 20 Drawing Sheets

(56) References Cited

U.S. PATENT DOCUMENTS

| | | | |
|---|---|---|---|
| 9,368,479 B2 | 6/2016 | Katkar et al. | |
| 9,412,675 B2 | 8/2016 | Gandhi et al. | |
| 9,613,881 B2 | 4/2017 | Ahn et al. | |
| 9,832,856 B2 | 11/2017 | Min et al. | |
| 10,181,454 B2 | 1/2019 | Park | |
| 10,211,123 B2 | 2/2019 | Son | |
| 10,461,014 B2 | 10/2019 | Lin et al. | |
| 2016/0343689 A1* | 11/2016 | Gandhi | H01L 23/49827 |
| 2018/0040592 A1 | 2/2018 | Gandhi et al. | |
| 2019/0318470 A1* | 10/2019 | Jung | H01L 25/0657 |
| 2020/0058519 A1* | 2/2020 | Tsai | H01L 25/0657 |

\* cited by examiner

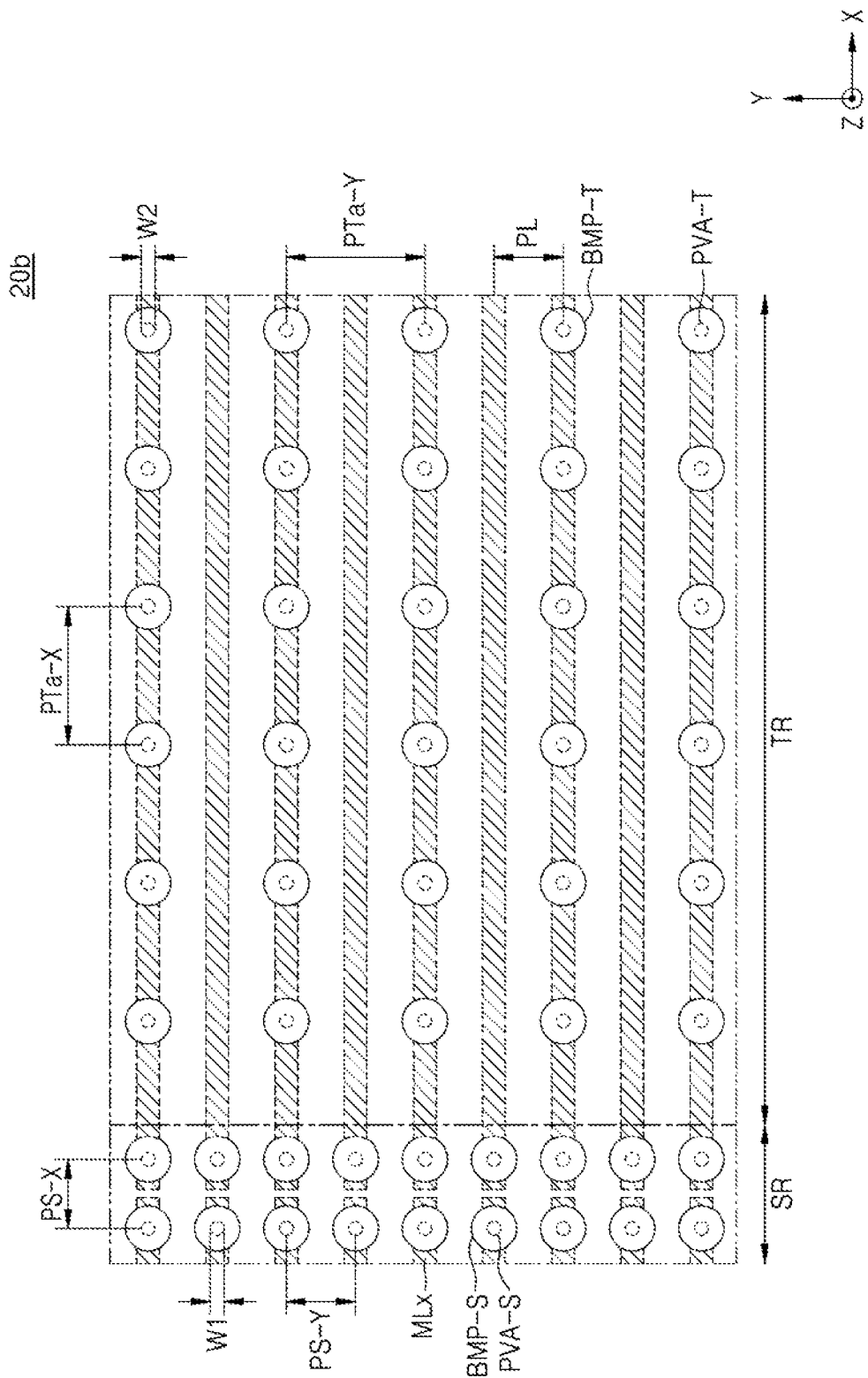

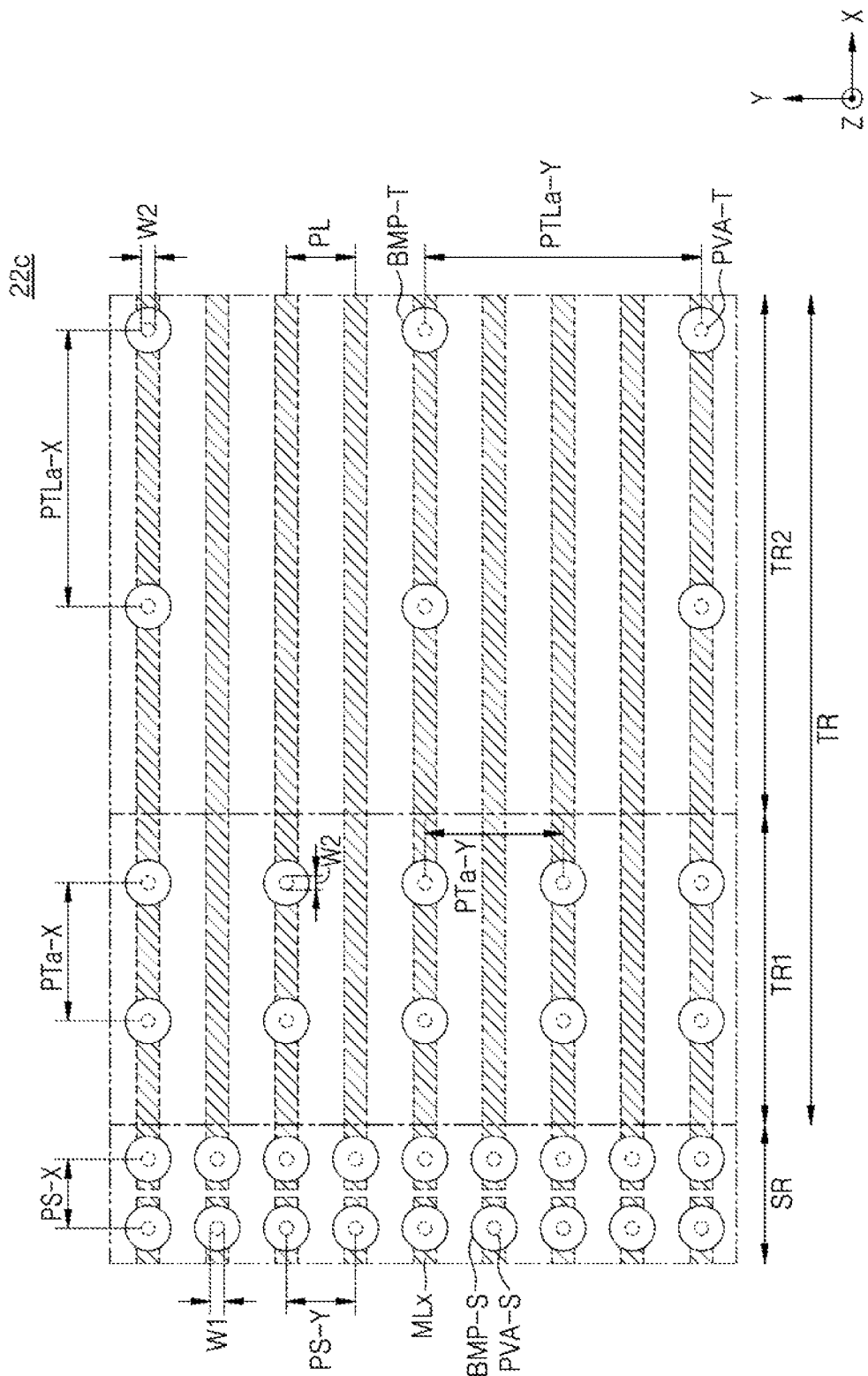

SEMICONDUCTOR PACKAGE

CROSS-REFERENCE TO RELATED APPLICATION

Korean Patent Application No. 10-2020-0053382, filed on May 4, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

As miniaturization, multi-functionality, and high-performance of electronic products are demanded, high integration and high-speed of semiconductor packages are also demanded. To this end, a semiconductor package having stacked semiconductor chips is being developed.

SUMMARY

Embodiments are directed to a semiconductor package, including: a lower semiconductor chip including a lower semiconductor substrate, a rear surface protecting layer covering a non-active surface of the lower semiconductor substrate, a plurality of lower via electrodes penetrating through the lower semiconductor substrate and the rear surface protecting layer, and a plurality of rear surface signal pads and a plurality of rear surface thermal pads arranged on the rear surface protecting layer; an upper semiconductor chip including an upper semiconductor substrate, a wiring structure on an active surface of the upper semiconductor substrate, a front surface protecting layer that covers the wiring structure and has a plurality of front surface openings, and a plurality of signal vias and a plurality of thermal vias that fill the plurality of front surface openings and are connected to the wiring structure; and a plurality of signal bumps connecting between the plurality of rear surface signal pads and the plurality of signal vias, and a plurality of thermal bumps connecting between the plurality of rear surface thermal pads and the plurality of thermal vias. The plurality of signal bumps and the plurality of thermal bumps may be between the lower semiconductor chip and the upper semiconductor chip. The plurality of rear surface signal pads may be connected to the plurality of lower via electrodes, and entire bottom surfaces of the plurality of rear surface thermal pads may be in contact with the rear surface protecting layer.

Embodiments are also directed to a semiconductor package, including: a first semiconductor chip including a first semiconductor substrate, a first wiring structure on an active surface of the first semiconductor substrate, a first front surface protecting layer covering the first wiring structure and having a plurality of first front surface openings, a first rear surface protecting layer covering a non-active surface of the first semiconductor substrate, a plurality of first via electrodes penetrating through the first semiconductor substrate and the first rear surface protecting layer, and a plurality of first signal pads and a plurality of first thermal pads arranged on the first rear surface protecting layer; a plurality of second semiconductor chips vertically stacked on the first semiconductor chip and each including a second semiconductor substrate, a second wiring structure on an active surface of the second semiconductor substrate, a second front surface protecting layer covering the second wiring structure and having a plurality of second front surface openings, a second rear surface protecting layer covering a non-active surface of the second semiconductor substrate, a plurality of second via electrodes penetrating through the second semiconductor substrate and the second rear surface protecting layer, a plurality of signal vias and a plurality of thermal vias filling the second front surface openings and connected to the second wiring structure, and a plurality of second signal pads and a plurality of second thermal pads arranged on the second rear surface protecting layer; a plurality of signal bumps connecting between first and second signal pads and the plurality of signal vias; and a plurality of thermal bumps connecting between first and second thermal pads and the plurality of thermal vias. The plurality of first signal pads may be connected to the plurality of first via electrodes. The plurality of second signal pads may be connected to the plurality of second via electrodes. Entire bottom surfaces of the plurality of first thermal pads may contact the first rear surface protecting layer. The entire bottom surfaces of the plurality of first thermal pads may contact the second rear surface protecting layer.

Embodiments are also directed to a semiconductor package, including: a lower semiconductor chip including a lower semiconductor substrate, a rear surface protecting layer covering a non-active surface of the lower semiconductor substrate, a plurality of lower via electrodes penetrating through the lower semiconductor substrate and the rear surface protecting layer, and a plurality of rear surface signal pads and a plurality of rear surface thermal pads arranged on the rear surface protecting layer; an upper semiconductor chip including an upper semiconductor substrate, a wiring structure on an active surface of the upper semiconductor substrate, a front surface protecting layer that covers the wiring structure and has a plurality of front surface openings, and a plurality of signal vias and a plurality of thermal vias that fill the plurality of front surface openings, are connected to the wiring structure, and each have a first horizontal width and a second horizontal width; a plurality of signal bumps connecting between the plurality of rear surface signal pads and the plurality of signal vias and arranged at a first pitch; and a plurality of thermal bumps connecting between the plurality of rear surface thermal pads and the plurality of thermal vias and arranged at a second pitch that is greater than the first pitch. The plurality of signal bumps and the plurality of thermal bumps may be between the lower semiconductor chip and the upper semiconductor chip. The plurality of rear surface signal pads may be connected to the plurality of lower via electrodes. The plurality of rear surface thermal pads may be separated from the plurality of lower via electrodes and the lower semiconductor substrate with the rear surface protecting layer therebetween.

BRIEF DESCRIPTION OF THE DRAWINGS

Features will become apparent to those of skill in the art by describing in detail example embodiments with reference to the attached drawings in which:

FIGS. 5A to 5D are partial plan views of an upper semiconductor chip included in a semiconductor package according to example embodiments, as viewed from below;

DETAILED DESCRIPTION

Figure 1:
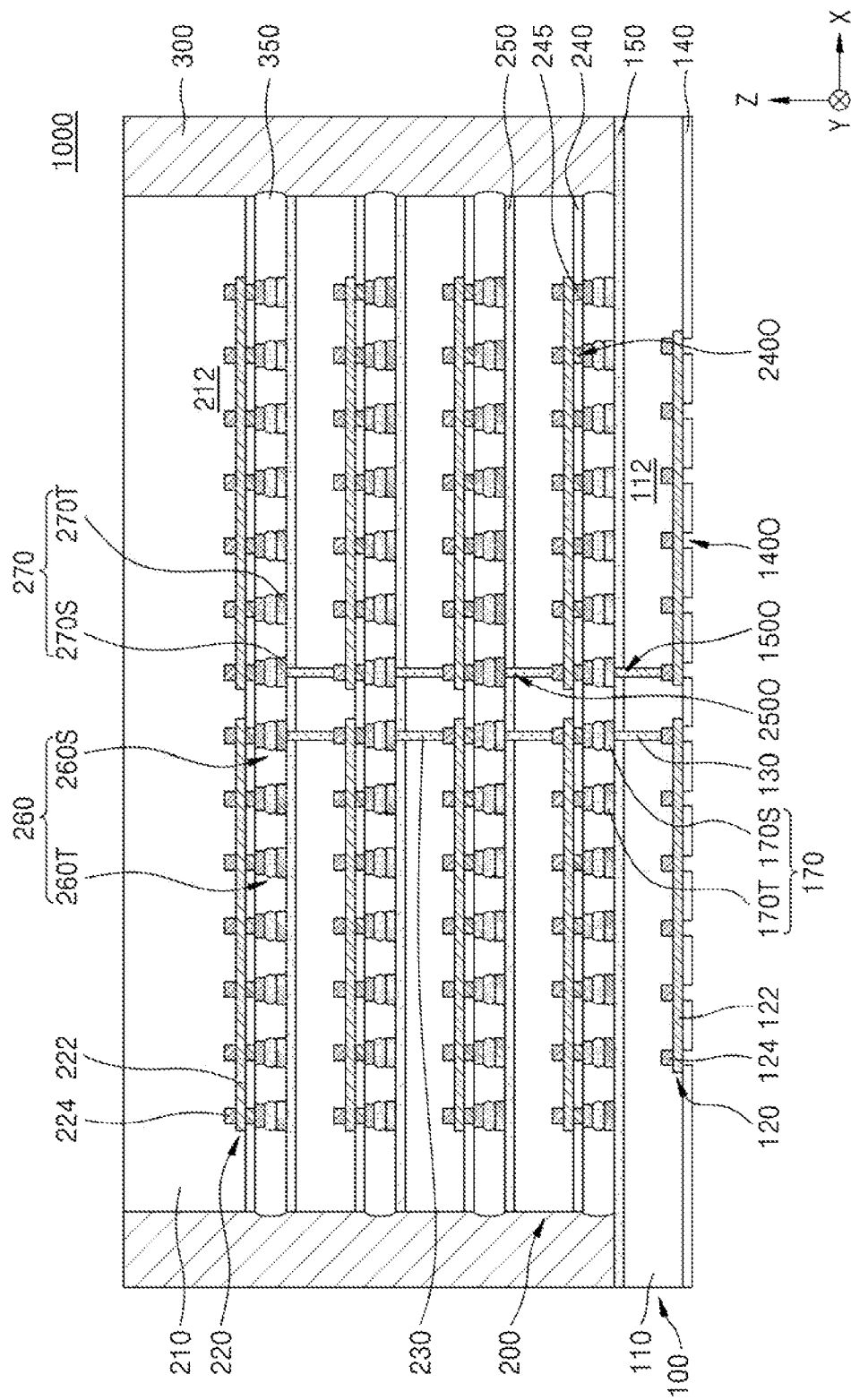
FIG. 1 is a cross-sectional view of a semiconductor package according to an example embodiment.

FIG. 1 is a cross-sectional view of a semiconductor package according to an example embodiment.

Referring to FIG. 1, a semiconductor package 1000 according to an example embodiment may include a first semiconductor chip 100 and a plurality of second semiconductor chips 200. Although FIG. 1 shows that the semiconductor package 1000 includes four second semiconductor chips 200, the semiconductor package 1000 may include, e.g., two or more second semiconductor chips 200. In an example embodiment, the number of second semiconductor chips 200 included in the semiconductor package 1000 may be a multiple of 4. The second semiconductor chips 200 may be stacked on the first semiconductor chip 100. The semiconductor package 1000 may be referred to as a sub-semiconductor package.

The first semiconductor chip 100 may include a first semiconductor substrate 110 having a first semiconductor device 112 on an active surface, a first wiring structure 120 on the active surface of the first semiconductor substrate 110, and a plurality of first via electrodes 130 that are connected to the first wiring structure 120 and penetrate at least a portion of the first semiconductor chip 100.

In the semiconductor package 1000, the first semiconductor chip 100 may be provided such that the active surface of the first semiconductor substrate 110 faces downward in FIG. 1 and a non-active surface thereof faces upward in FIG. 1. Therefore, unless stated otherwise in the present specification, the top surface and the bottom surface of the first semiconductor chip 100 of the semiconductor package 1000 refer to sides facing the non-active surface and the active surface of the first semiconductor substrate 110, respectively. However, to describe based on the first semiconductor chip 100, the bottom surface of the first semiconductor chip 100 facing the active surface of the first semiconductor substrate 110 may be referred to as the front surface of the first semiconductor chip 100, and the top surface of the first semiconductor chip 100 facing the non-active surface thereof may be referred to as the rear surface of the first semiconductor chip 100. In FIG. 1, the front surface of the first semiconductor chip 100 faces downward.

A second semiconductor chip 200 may include a second semiconductor substrate 210 having a second semiconductor device 212 on an active surface and a second wiring structure 220 on the active surface of the second semiconductor substrate 210.

The second semiconductor chip 200 may further include a plurality of second via electrodes 230 that are connected to the second wiring structure 220 and penetrate at least a portion of the second semiconductor chip 200. In an example embodiment, from among the plurality of second semiconductor chips 200, the topmost second semiconductor chip 200 (which is the farthest from the first semiconductor chip 100) may not include a second via electrode 230. In an example embodiment, from among the second semiconductor chips 200, the topmost second semiconductor chip 200 (which is the farthest from the first semiconductor chip 100) may have a thickness greater than that of each of the other second semiconductor chips 200.

Within the semiconductor package 1000, the second semiconductor chips 200 may be sequentially stacked on the first semiconductor chip 100 in the vertical direction (Z direction) and the active surfaces thereof may each face downward. Therefore, unless stated otherwise in the present specification, the top surface and the bottom surface of a second semiconductor chip 200 of the semiconductor package 1000 refer to sides facing the non-active surface and the active surface of the second semiconductor substrate 210, respectively. However, to describe based on the second semiconductor chip 200, the bottom surface of the second semiconductor chip 200 facing the active surface of the second semiconductor substrate 210 may be referred to as the front surface of the second semiconductor chip 200, and the top surface of the second semiconductor chip 200 facing the non-active surface thereof may be referred to as the rear surface of the second semiconductor chip 200.

The first semiconductor substrate 110 and the second semiconductor substrate 210 may include a semiconductor material, e.g., silicon (Si). In an implementation, the first semiconductor substrate 110 and the second semiconductor substrate 210 may include a semiconductor material, e.g., germanium (Ge). In an implementation, the first semiconductor substrate 110 and the second semiconductor substrate 210 may include a compound semiconductor, e.g., silicon carbide (SiC), gallium arsenide (GaAs), indium arsenide (InAs), or indium phosphide (InP). The first semiconductor substrate 110 and the second semiconductor substrate 210 may each have an active surface and a non-active surface, which is opposite to the active surface. The first semiconductor substrate 110 and the second semiconductor substrate 210 may each include a conductive region, e.g., a well that is doped with impurities. The first semiconductor substrate 110 and the second semiconductor substrate 210 may have various device isolation structures like a shallow trench isolation (STI) structure.

The first semiconductor device 112 and the second semiconductor device 212 may each include a plurality of individual devices of various types. The individual devices may include various microelectronic devices, e.g., a metal-oxide-semiconductor field effect transistor (MOSFET) like a complementary metal-insulator-semiconductor (CMOS) transistor, a system large scale integration (LSI), an image sensor like a CMOS imaging sensor (CIS), a micro-electro-mechanical system (MEMS), an active device, a passive device, etc. The individual devices may be electrically connected to the conductive region of the first semiconductor substrate 110 or the second semiconductor substrate 210. The first semiconductor device 112 and the second semiconductor device 212 may each further include a conductive wire or a conductive plug for electrically connecting at least two of the individual devices or all of the individual devices to respective conductive regions of the first semiconductor substrate 110 and the second semiconductor substrate 210.

Also, the individual devices may each be electrically separated from other neighboring individual devices by an insulating film.

The first semiconductor chip 100 and the second semiconductor chip 200 may each be, e.g., a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. The first semiconductor chip 100 and the second semiconductor chip 200 may each be, e.g., a central processing unit (CPU) chip, a graphics processing unit (GPU) chip, or an application processor (AP).

In an example embodiment, the semiconductor package 1000 including the first semiconductor chip 100 and the second semiconductor chips 200 may be referred to as a High Bandwidth Memory (HBM) DRAM semiconductor package. The first semiconductor chip 100 may include, e.g., a serial-parallel conversion circuit and may serve as a buffer chip for controlling the second semiconductor chips 200, and the second semiconductor chips 200 may be core chips including DRAM memory cells. In an example embodiment, the first semiconductor chip 100 may be referred to as a master chip or a main chip. The second semiconductor chips 200 may each be referred to as a slave chip, or a secondary or controlled chip.

The first wiring structure 120 may include a plurality of first wiring patterns 122 and a plurality of first wiring vias 124 connected to the first wiring patterns 122, and the second wiring structure 220 may include a plurality of second wiring patterns 222 and a plurality of second wiring vias 224 connected to the second wiring patterns 222. The first wiring structure 120 and the second wiring structure 220 may include, e.g., a metal, e.g., aluminum, copper, or tungsten. In an example embodiment, the first wiring structure 120 and the second wiring structure 220 may each include a wiring barrier film and a wiring metal layer. The wiring barrier film may include a nitride or an oxide of a metal like Ti, Ta, Ru, Mn, Co, or W or an alloy like cobalt tungsten phosphide (CoWP), cobalt tungsten boron (CoWB), or cobalt tungsten boron phosphide (CoWBP). The wiring metal layer may include at least one metal selected from among W, Al, Ti, Ta, Ru, Mn, and Cu. The first wiring patterns 122 and the second wiring patterns 222 may each have a thickness of about 0.5 μm or less.

Although FIG. 1 shows that the first wiring patterns 122 and the second wiring patterns 222 are at one vertical level, the first wiring structure 120 may be a multilayered wiring structure having the first wiring patterns 122 and the first wiring vias 124 at different vertical levels, and the second wiring structure 220 may be a multilayered wiring structure having the second wiring patterns 222 and the second wiring vias 224 at different vertical levels.

The first semiconductor chip 100 and the second semiconductor chip 200 may each include an inter-wire insulation layer surrounding the first wiring structure 120 and the second wiring structure 220. In an example embodiment, when the first wiring structure 120 and the second wiring structure 220 are multilayered wiring structures, the inter-wire insulation layer may have a multilayered structure in which a plurality of insulation layers are stacked in correspondence to the multilayered wiring structures of the first wiring structure 120 and the second wiring structure 220.

The first semiconductor chip 100 may further include a first rear surface protecting layer 150, which is provided on the top surface of the first semiconductor chip 100 and covers the non-active surface of the first semiconductor substrate 110, and a first front surface protecting layer 140, which is provided on the bottom surface of the first semiconductor chip 100 and partially covers the first wiring structure 120.

Each of the second semiconductor chips 100 may further include a second rear surface protecting layer 250, which is provided on the top surface of the second semiconductor chip 200 and covers the non-active surface of the second semiconductor substrate 210, and a second front surface protecting layer 240, which is provided on the bottom surface of the second semiconductor chip 200 and partially covers the second wiring structure 220. In an example embodiment, from among the second semiconductor chips 200, the topmost second semiconductor chip 200 that is the farthest from the first semiconductor chip 100 may not include the second rear surface protecting layer 250.

The first front surface protecting layer 140 and the second front surface protecting layer 240 may each include, e.g., an oxide, a nitride, a polymer, or a combination thereof. For example, the first front surface protecting layer 140 and the second front surface protecting layer 240 may include a polymer formed from photosensitive polyimide (PSPI). In an example embodiment, the first front surface protecting layer 140 and the second front surface protecting layer 240 may have a multilayered structure in which at least two insulation layers are stacked. For example, the first front surface protecting layer 140 and the second front surface protecting layer 240 may have a multilayered structure in which a layer including a nitride and a layer including PSPI are stacked. In an implementation, e.g., the first front surface protecting layer 140 and the second front surface protecting layer 240 may have a multilayered structure in which a layer including a nitride and a layer including TEOS are stacked. The first front surface protecting layer 140 and the second front surface protecting layer 240 may each have a thickness of, e.g., several μm. In an example embodiment, the first front surface protecting layer 140 and the second front surface protecting layer 240 may each have a thickness from about 2 μm to about 5 μm.

The first rear surface protecting layer 150 and the second rear surface protecting layer 250 may each include, e.g., an oxide, a nitride, a polymer, or a combination thereof. In an example embodiment, the first rear surface protecting layer 150 and the second rear surface protecting layer 250 may include a polymer fabricated through a spin coating process or a spray process.

The first front surface protecting layer 140 may have a plurality of first front surface openings 140O partially exposing the first wiring structure 120. The second front surface protecting layer 240 may have a plurality of second front surface openings 240O partially exposing the second wiring structure 220.

The first rear surface protecting layer 150 may have a plurality of first rear surface openings 150O. The second rear surface protecting layer 250 may have a plurality of second rear surface openings 250O.

Each of the first via electrodes 130 may be connected to the first wiring structure 120, and may penetrate through the first semiconductor substrate 110 and the first rear surface protecting layer 150, thereby extending to the top surface of the first semiconductor chip 100, that is, the rear surface of the first semiconductor chip 100. Each of the first via electrodes 130 may penetrate the first rear surface protecting layer 150 through the first rear surface openings 150O. Each of the second via electrodes 230 may be connected to the second wiring structure 220, and may penetrate through the second semiconductor substrate 210 and the second rear surface protecting layer 250, thereby extending to the top surface of the second semiconductor chip 200, that is, the rear surface of the second semiconductor chip 200. Each of the second via electrodes 230 may penetrate the second rear surface protecting layer 250 through the second rear surface openings 250O.

The first via electrodes 130 and the second via electrodes 230 may be Through Silicon Vias (TSVs). The first via electrode 130 and the second via electrode 230 may each include a conductive plug penetrating through the first semiconductor substrate 110 or the second semiconductor substrate 210 and a conductive barrier film surrounding the conductive plug. The conductive plug may have a cylindrical shape, and the conductive barrier film may have a cylindrical shape surrounding the sidewall of the conductive plug. Via insulation films may be between the first via electrode 130 and the first semiconductor substrate 110 and between the second via electrode 230 and the second semiconductor substrate 210, thereby surrounding the sidewalls of the first via electrode 130 and the second via electrode 230. The first via electrode 130 and the second via electrode 230 may have any one of a via-first structure, a via-middle structure, and a via-last structure.

The conductive plug may include, e.g., Cu or W. For example, the conductive plug may include Cu, CuSn, CuMg, CuNi, CuZn, CuPd, CuAu, CuRe, CuW, W, or a W alloy. The conductive barrier film may include one or more from among, e.g., Al, Au, Be, Bi, Co, Cu, Hf, In, Mn, Mo, Ni, Pb, Pd, Pt, Rh, Re, Ru, Ta, Te, Ti, W, Zn, and Zr. In another implementation, the conductive barrier film may include a stack structure of one or more thereof. In an example embodiment, the conductive barrier film may include at least one material selected from among W, WN, WC, Ti, TiN, Ta, TaN, Ru, Co, Mn, WN, Ni, and NiB, and may include a single layer or multiple layers. The conductive plug and the conductive barrier film may be formed through, e.g., a physical vapor deposition (PVD) process or a chemical vapor deposition (CVD) process. The via insulation film may include an oxide film, a nitride film, a carbonized film, a polymer, or a combination thereof. In an example embodiment, the via insulation film may be formed through a CVD process. For example, the via insulation film may include an $O_3$/TEOS-based high aspect ratio process (HARP) oxide film formed through a sub-atmospheric CVD process.

A plurality of connecting vias 245 contacting a portion of the second wiring structure 220 may be arranged in the second front surface openings 240O. In an example embodiment, the connecting vias 245 may contact the second wiring patterns 222 of the second wiring structure 220, thereby being electrically and/or thermally connected to the second wiring patterns 222.

A plurality of connecting bumps 260 connected to a plurality of connecting vias 245 may be attached onto the bottom surface of the second semiconductor chip 200, that is, the front surface of the second semiconductor chip 200. The connecting bumps 260 may include a plurality of signal bumps 260S and a plurality of thermal bumps 260T. Detailed descriptions of the signal bumps 260S and the thermal bumps 260T will be given below with reference to FIGS. 3A to 3D. The connecting bumps 260 attached to the front surface of the second semiconductor chip 200 may be referred to as second connecting bumps to be distinguished from first connecting bumps 160 shown in FIG. 7.

The signal bumps 260S may provide at least one of a signal, power, or ground for the second semiconductor chip 200, whereas the thermal bumps 260T may perform a function for dissipating heat generated inside the second semiconductor chip 200 to the outside without providing at least one of a signal, power, or ground for the second semiconductor chip 200. The signal bumps 260S may provide at least one of a signal, power, or ground for the second semiconductor chip 200 and, simultaneously, dissipate heat generated inside the second semiconductor chip 200 to the outside.

In an example embodiment, at least some of the thermal bumps 260T may be electrically connected to at least one of the signal bumps 260S through the second wiring patterns 222. In an example embodiment, some of the thermal bumps 260T may be electrically connected to a second wiring pattern 222 that is not electrically connected to the signal bumps 260S from among the second wiring patterns 222. The second wiring pattern 222 that is not electrically connected to the signal bumps 260S from among the second wiring patterns 222 may be referred to as a dummy wiring pattern, and a second wiring pattern 222 that is electrically connected to at least one of the signal bumps 260S may be referred to as a signal wiring pattern.

A plurality of first rear surface pads 170 may be arranged on the top surface of the first semiconductor chip 100, that is, the rear surface of the first semiconductor chip 100. The first rear surface pads 170 may be arranged on the first rear surface protecting layer 150. A plurality of second rear surface pads 270 may be arranged on the top surfaces of the second semiconductor chips 200, that is, the rear surfaces of the second semiconductor chips 200. The second rear surface pads 270 may be arranged on the second rear surface protecting layer 250. In an example embodiment, from among the second semiconductor chips 200, no second rear surface pad 270 may be provided on the rear surface of the topmost second semiconductor chip 200 that is the farthest from the first semiconductor chip 100.

The first rear surface pads 170 may include a plurality of first signal pads 170S and a plurality of first thermal pads 170T. The second rear surface pads 270 may include a plurality of second signal pads 270S and a plurality of second thermal pads 270T. Each of the first rear surface pads 170 and each of the second rear surface pads 270 may be referred to as a rear pad, each of the first signal pads 170S and each of the second signal pads 270S may be referred to as a rear surface signal pad, and each of the first thermal pads 170T and each of the second thermal pads 270T may be referred to as a rear surface thermal pad.

From among the first rear surface pads 170, the first signal pads 170S may be connected to the first via electrodes 130, whereas the first thermal pads 170T may not be connected to the first via electrodes 130. Center portions of the bottom surfaces of the first signal pads 170S may contact the top surfaces of the first via electrodes 130, whereas the remaining portions of the bottom surfaces of the first signal pads 170S may contact portions of the first rear surface protecting layer 150. Also, entire bottom surfaces of the first thermal pads 170T may contact portions of the first rear surface protecting layer 150.

From among the second rear surface pads 270, the second signal pads 270S may be connected to the second via electrodes 230, whereas the second thermal pads 270T may not be connected to the second via electrodes 230. Center portions of the bottom surfaces of the second signal pads 270S may contact the top surfaces of the second via electrodes 230, whereas the remaining portions of the bottom surfaces of the second signal pads 270S may contact portions of the second rear surface protecting layer 250. Also, entire bottom surfaces of the second thermal pads 270T may contact portions of the second rear surface protecting layer 250.

The connecting bumps 260 may be connected to the rear pads, respectively. Each of the connecting bumps 260 may be provided between the connecting via 245 and a rear surface pad, thereby electrically and/or thermally connecting the connecting via 245 to the rear surface pad. In detail, the connecting bumps 260 of the bottommost second semiconductor chip 200 closest to the first semiconductor chip 100 from among the second semiconductor chips 200 may be connected to the first rear surface pads 170 of the first semiconductor chip 100 below the bottommost second semiconductor chip 200, whereas the connecting bumps 260 of each of the remaining second semiconductor chips 200 may be connected to the second rear surface pads 270 of another semiconductor chip 200 below.

From among the connecting bumps 260, each of the signal bumps 260S may be provided between the connecting via 245 and a rear surface signal pad, and each of the thermal bumps 260T may be provided between the connecting via 245 and a rear surface thermal pad.

In detail, the signal bumps 260S of the bottommost second semiconductor chip 200 closest to the first semiconductor chip 100 from among the second semiconductor chips 200 may be connected to the first signal pads 170S of the first semiconductor chip 100 below the bottommost second semiconductor chip 200, and the thermal bumps 260T of the bottommost second semiconductor chips 200 may be connected to the first thermal pads 170T of the first semiconductor chip 100. Also, the signal bumps 260S of each of the remaining second semiconductor chips 200 may be connected to the second signal pads 270S of another second semiconductor chip 200 below, and the thermal bumps 260T of each of the remaining second semiconductor chips 200 may be connected to the second thermal pads 270T of the other second semiconductor chips 200 below.

In the present specification, from between two semiconductor chips adjacent to each other in the vertical direction (Z direction) from among the first semiconductor chip 100 and the second semiconductor chips 200 (e.g., the bottommost second semiconductor chip 200 closest to the first semiconductor chip 100 from among the second semiconductor chips 200 and the first semiconductor chip 100, or from among two second semiconductor chips 200 adjacent to each other in the vertical direction (Z direction) from among the second semiconductor chips 200), an upper one may be referred to as an upper semiconductor chip, and a lower one may be referred to as a lower semiconductor chip.

For example, from between the bottommost second semiconductor chip 200 (closest to the first semiconductor chip 100 from among the second semiconductor chips 200) and the first semiconductor chip 100, the bottommost second semiconductor chip 200 may be referred to as an upper semiconductor chip, and the first semiconductor chip 100 may be referred to as a lower semiconductor chip. Also, e.g., from between the two second semiconductor chips 200 adjacent to each other in the vertical direction (Z direction), an upper second semiconductor chip 200 may be referred to as an upper semiconductor chip, and a lower second semiconductor chip 200 may be referred to as a lower semiconductor chip.

The connecting bumps 260 may be arranged between the upper semiconductor chip and the lower semiconductor chip, and each of the connecting bumps 260 may be provided between the connecting via 245 of the upper semiconductor chip and a rear pad of the lower semiconductor chip, thereby electrically and/or thermally connecting the upper semiconductor chip and the lower semiconductor chip.

Also, the signal bumps 260S of the upper semiconductor chip may be connected to rear surface signal pads of the lower semiconductor chip, that is, the first signal pads 170S or the second signal pads 270S, whereas the thermal bumps 260T of the upper semiconductor chip may be connected to rear surface thermal pads of the lower semiconductor chip, that is, the first thermal pads 170T or the second thermal pads 270T.

An insulating adhesive layer 350 may be between the first semiconductor chip 100 and each of the second semiconductor chips 200. The insulating adhesive layer 350 may include a non-conductive film (NCF), a non-conductive paste (NCP), an insulating polymer, or an epoxy resin. The insulating adhesive layer 350 may surround the connecting bumps 260 and fill gaps between the first semiconductor chip 100 and the second semiconductor chips 200.

A horizontal width and a horizontal area of the first semiconductor chip 100 may have values greater than a horizontal width and a horizontal area of each of the second semiconductor chips 200. The semiconductor package 1000 may further include a molding layer 300 surrounding the side surfaces of the second semiconductor chips 200 and the side surfaces of the insulating adhesive layer 350 on the first semiconductor chip 100. The molding layer 300 may include, e.g., an epoxy molding compound (EMC).

In an example embodiment, the connecting vias 245 may have various horizontal widths. In an example embodiment, the connecting bumps 260 may be arranged at various pitches. Detailed descriptions of the horizontal width of the connecting vias 245 and the arrangement of the connecting bumps 260 will be given below with reference to FIGS. 2A to 6D.

In the semiconductor package 1000 according to the present example embodiment, because the thermal bumps 260T are connected to the second wiring structure 220 through the connecting vias 245, heat generated inside the second semiconductor chip 200 may be smoothly dissipated to the outside of the second semiconductor chip 200 through the thermal bumps 260T. Also, because the thermal bumps 260T contact the rear surface thermal pads, that is, the first thermal pads 170T or the second thermal pads 270T, heat generated in the upper semiconductor chip of the semiconductor package 1000 may be transferred to the lower semiconductor chip through the thermal bumps 260T and a plurality of rear surface thermal pads.

Figure 2A:
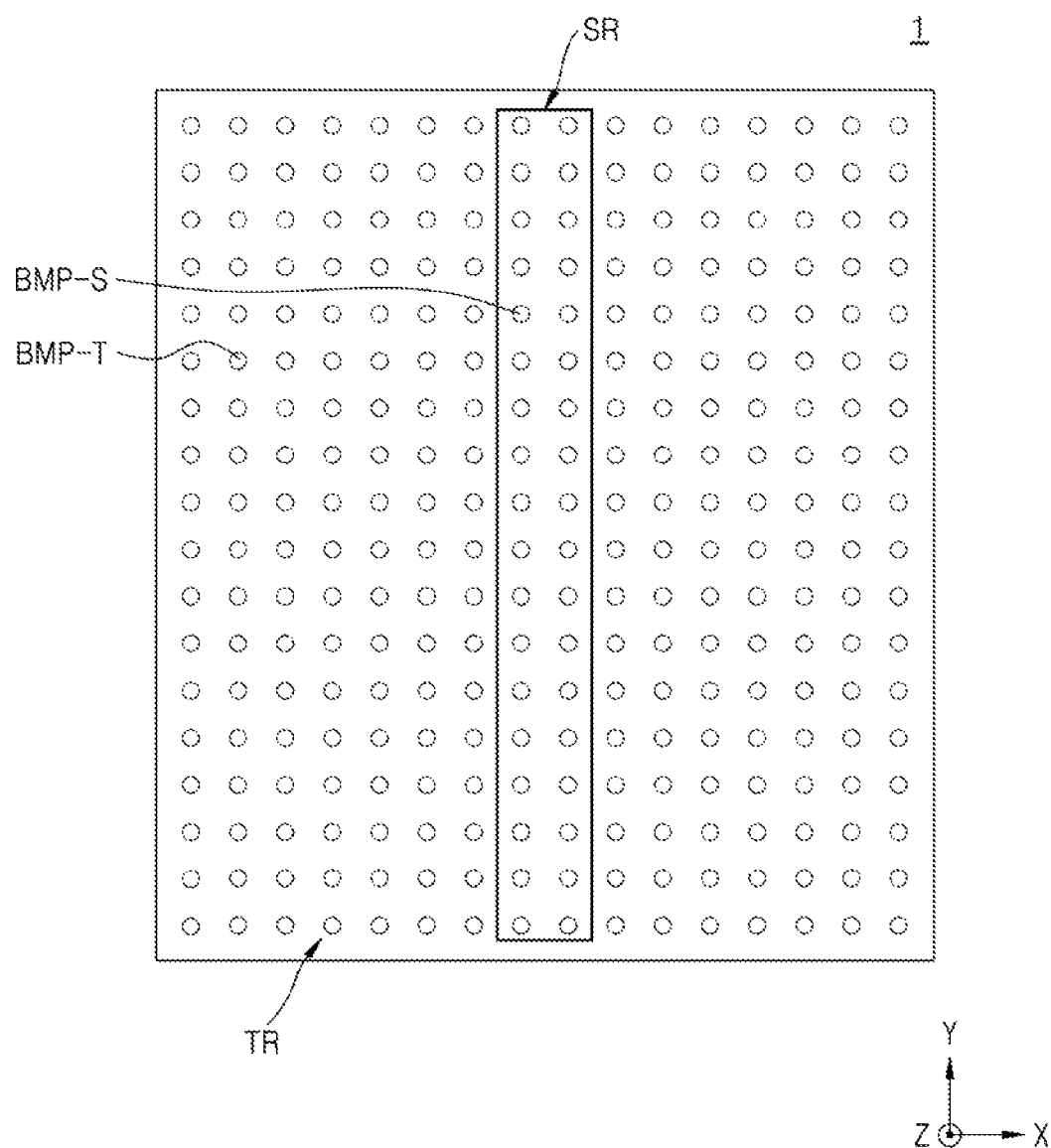
FIGS. 2A and 2B are diagrams showing schematic layouts of planar arrangements of bumps connected to a semiconductor chip of a semiconductor package according to example embodiments.
Figure 2B:
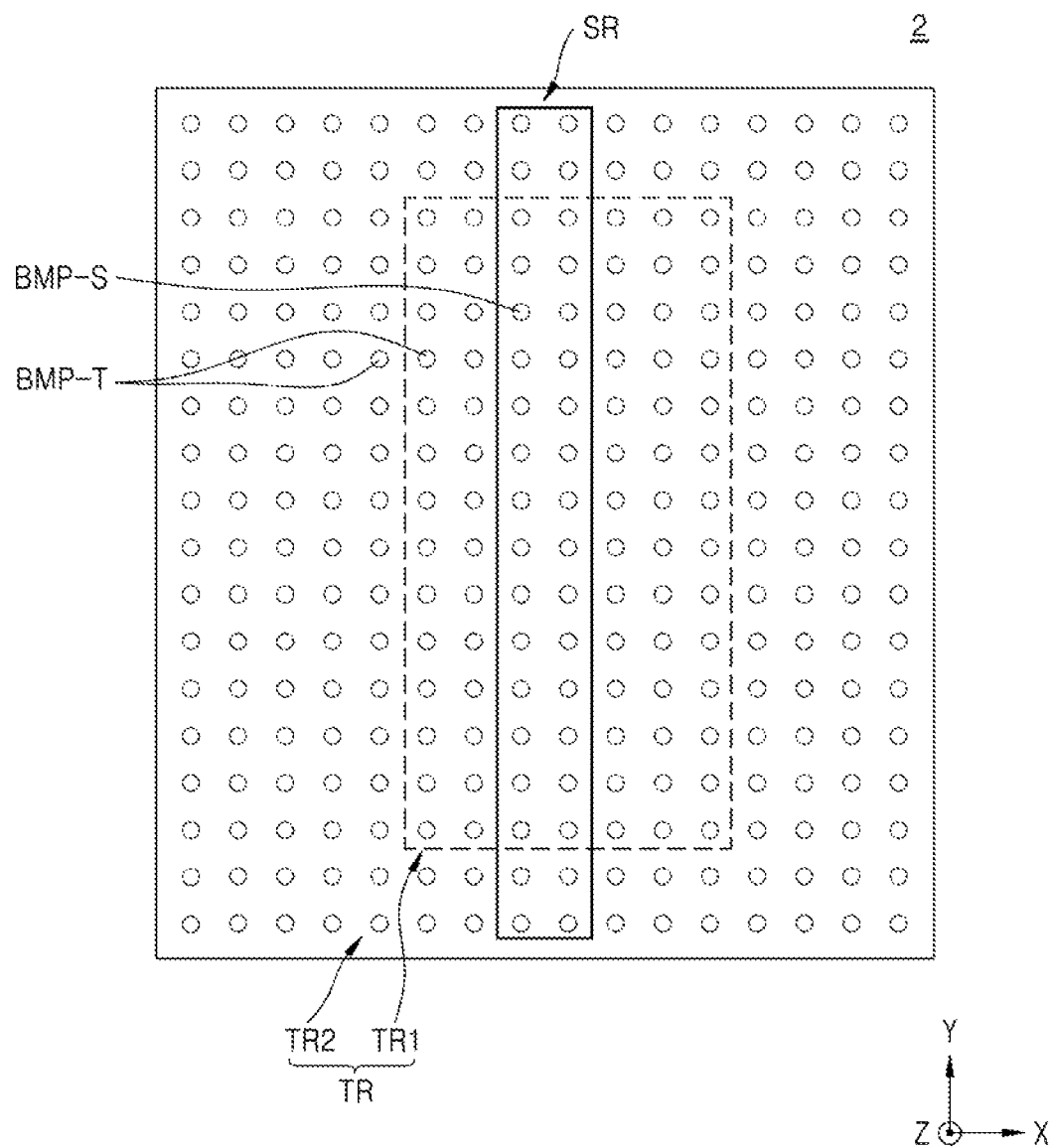

FIGS. 2A and 2B are diagrams showing schematic layouts of planar arrangements of bumps connected to an upper semiconductor chip of a semiconductor package according to example embodiments.

Referring to FIG. 2A, an upper semiconductor chip 1 may include a signal region SR and a thermal region TR. The upper semiconductor chip 1 may be the second semiconductor chip 200 shown in FIG. 1.

The second via electrode 230 shown in FIG. 1 may be in the signal region SR. The signal region SR may have a constant horizontal width and extend between opposite edges of the upper semiconductor chip 1. For example, the horizontal width of the signal region SR may be hundreds of μm. The signal region SR may be disposed along the center axis of the upper semiconductor chip 1 to extend in the long axis direction (e.g., the Y direction). For example, when viewed from above, the signal region SR may be at the center of the upper semiconductor chip 1, and the thermal region TR may be adjacent to edges of the upper semiconductor chip 1 to surround the signal region SR. In another example embodiment, the signal region SR may be along the center axis of the upper semiconductor chip 1 to extend in the short axis direction (e.g., the X direction) or may be along an edge of the upper semiconductor chip 1.

In the signal region SR, a plurality of signal bumps BMP-S may be formed in a matrix having columns and rows. For example, hundreds to thousands of signal bumps BMP-S may be arranged in a matrix in the signal region SR. In the signal region SR, the signal bumps BMP-S may form a matrix with a constant pitch of dozens of µm in a first horizontal direction (X direction) and a constant pitch of dozens of µm in a second horizontal direction (Y direction) perpendicular to the first horizontal direction (X direction). For example, the signal bumps BMP-S may form a matrix having a pitch of about 20 µm to about 40 µm each in the first horizontal direction (X direction) and the second horizontal direction (Y direction). For example, the signal bumps BMP-S may be center pads arranged at the center portion of the upper semiconductor chip 1 when viewed from above, for example. In an example embodiment, the signal bumps BMP-S may be edge pads that are arranged on portions adjacent to the edges of the upper semiconductor chip 1 when viewed from above.

In an example embodiment, the signal region SR of the upper semiconductor chip 1 and/or the arrangement of the signal bumps BMP-S in the signal region SR may be defined by a standard protocol like the JEDEC Standard.

In the thermal region TR, a plurality of thermal bumps BMP-T may be formed in a matrix having columns and rows. For example, hundreds to thousands of thermal bumps BMP-T may be arranged in a matrix in the thermal region TR. In the thermal region TR, the thermal bumps BMP-T may form a matrix with a constant pitch of dozens of µm in the first horizontal direction (X direction) and a constant pitch of dozens of µm in the second horizontal direction (Y direction). For example, the thermal bumps BMP-T may form a matrix having a pitch of about 20 µm to about 60 µm each in the first horizontal direction (X direction) and the second horizontal direction (Y direction).

Although FIG. 2A shows that the signal bumps BMP-S and the thermal bumps BMP-T are arranged at the same pitch, the thermal bumps BMP-T may be arranged at, e.g., a greater pitch than the signal bumps BMP-S. In an example embodiment, the horizontal width of the connecting vias (245 in FIG. 1) respectively connected to the signal bumps BMP-S and the horizontal width of the connecting vias 245 respectively connected to the thermal bumps BMP-T may have different values. Detailed descriptions of the arrangements of the signal bumps BMP-S and the thermal bumps BMP-T and the horizontal width of the connecting vias 245 will be given below with reference to FIGS. 3A, 3B, 3C, 4A, 4B, 5A, 5B, 6A, and 6B.

Referring to FIG. 2B, an upper semiconductor chip 2 may include the signal region SR and the thermal region TR. The upper semiconductor chip 2 may be the second semiconductor chip 200 shown in FIG. 1. Because the signal region SR is substantially the same as the signal region SR shown in FIG. 2A, detailed descriptions thereof will be omitted.

In the thermal region TR, a plurality of thermal bumps BMP-T may be formed in a matrix having columns and rows. For example, hundreds to thousands of thermal bumps BMP-T may be arranged in a matrix in the thermal region TR. In the thermal region TR, the thermal bumps BMP-T may form a matrix with a pitch of dozens of µm in the first horizontal direction (X direction) and a pitch of dozens of µm in the second horizontal direction (Y direction). For example, the thermal bumps BMP-T may form a matrix having a pitch of about 20 µm to about 60 µm each in the first horizontal direction (X direction) and the second horizontal direction (Y direction). The thermal region TR may include a first thermal region TR1 and a second thermal region TR2. For example, when viewed from above, the first thermal region TR1 may be adjacent to the signal region SR, which is the center of the upper semiconductor chip 2, and the second thermal region TR2 may be relatively close to the edges of the upper semiconductor chip 2 as compared to the first thermal region TR1.

Although FIG. 2B shows that the signal bumps BMP-S and the thermal bumps BMP-T are arranged at the same pitch, the thermal bumps BMP-T may be arranged at, e.g., a greater pitch than the signal bumps BMP-S. In an example embodiment, the thermal bumps BMP-T arranged in the second thermal region TR2 may be arranged at a greater pitch than the thermal bumps BMP-T arranged in the first thermal region TR1. In an example embodiment, the horizontal width of the connecting vias (245 in FIG. 1) respectively connected to the thermal bumps BMP-T arranged in the first thermal region TR1 and the horizontal width of the connecting vias (245 in FIG. 1) respectively connected to the thermal bumps BMP-T arranged in the second thermal region TR2 may have different values. Detailed descriptions of the arrangements of the signal bumps BMP-S and the thermal bumps BMP-T and the horizontal width of the connecting vias 245 will be given below with reference to FIGS. 3D, 4C, 4D, 5C, 5D, 6C, and 6D.

FIGS. 3A to 3D are partial cross-sectional views of bumps of a semiconductor package according to example embodiments.

Figure 3A:
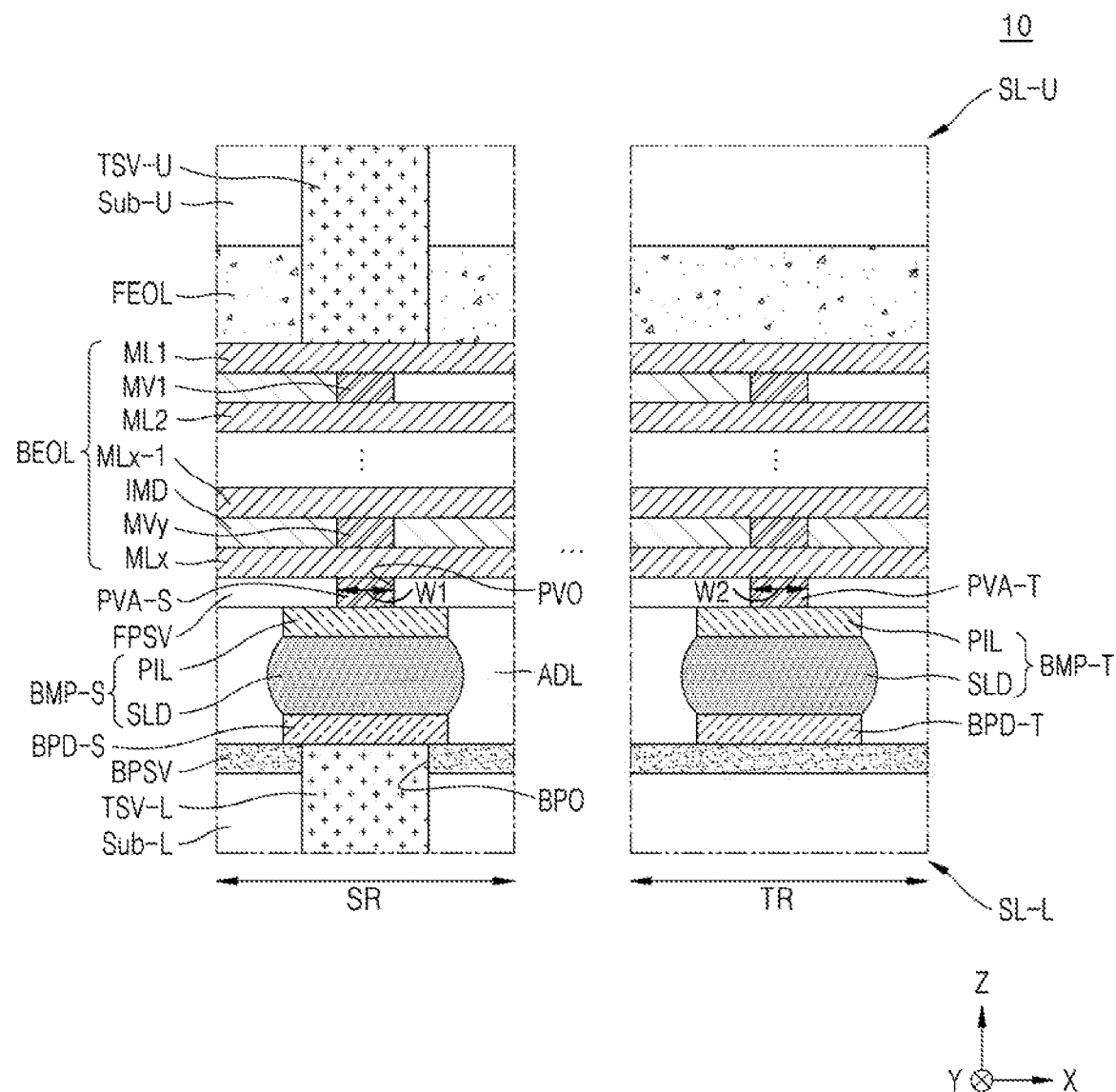
FIGS. 3A to 3D are partial cross-sectional views of bumps of a semiconductor package according to example embodiments.

Referring to FIG. 3A, a semiconductor package 10 according to an example embodiment may include an upper semiconductor chip SL-U and a lower semiconductor chip SL-L. The upper semiconductor chip SL-U may be any one of the second semiconductor chips 200 shown in FIG. 1. The lower semiconductor chip SL-L may be any one of the second semiconductor chips 200 shown in FIG. 1 (other than the topmost second semiconductor chip 200) and may be below the upper semiconductor chip SL-U.

The upper semiconductor chip SL-U may include an upper semiconductor substrate Sub-U, a device layer FEOL, a wiring layer BEOL, an upper via electrode TSV-U, a front surface protecting layer FPSV, signal vias PVA-S, and thermal vias PVA-T. In an example embodiment, when the upper semiconductor chip SL-U is the topmost second semiconductor chip 200 farthest from the first semiconductor chip 100 from among the second semiconductor chips 200 shown in FIG. 1, the upper semiconductor chip SL-U may not include the upper via electrode TSV-U. The upper semiconductor substrate Sub-U may be the second semiconductor substrate 210 shown in FIG. 1. The upper semiconductor substrate Sub-U and the device layer FEOL may constitute the second semiconductor device 212 shown in FIG. 1, and the device layer FEOL may include various conductive layers and insulation layers for configuring the second semiconductor device 212. The wiring layer BEOL may include the second wiring structure 220 shown in FIG. 1, the upper via electrode TSV-U may be the second via electrode 230 shown in FIG. 1, the front surface protecting layer FPSV may be the second front surface protecting layer 240 having the second front surface openings 240O shown in FIG. 1, and the signal vias PVA-S and the thermal vias PVA-T may be the connecting vias 245 shown in FIG. 1.

The lower semiconductor chip SL-L may include a lower semiconductor substrate Sub-L, a lower via electrode TSV- L, a rear surface protecting layer BPSV, rear surface signal pads BPD-S, and rear surface thermal pads BPD-T. When the lower semiconductor chip SL-L is the first semiconductor chip 100 shown in FIG. 1, the lower semiconductor substrate Sub-L may be the first semiconductor substrate 110 shown in FIG. 1, the lower via electrode TSV-L may be the first via electrode 130 shown in FIG. 1, the rear surface protecting layer BPSV having a plurality of rear surface openings BPO may be the first rear surface protecting layer 150 having the first rear surface openings 150O shown in FIG. 1, and the rear surface signal pad BPD-S and the rear surface thermal pad BPD-T may be the first signal pads 170S and the first thermal pads 170T shown in FIG. 1. When the lower semiconductor chip SL-L is the second semiconductor chip 200 shown in FIG. 1, the lower semiconductor substrate Sub-L may be the second semiconductor substrate 210 shown in FIG. 1, the lower via electrode TSV-L may be the second via electrode 230 shown in FIG. 1, the rear surface protecting layer BPSV may be the second rear surface protecting layer 250 shown in FIG. 1, and the rear surface signal pads BPD-S and the rear surface thermal pads BPD-T may be the second signal pads 270S and the second thermal pads 270T shown in FIG. 1.

The wiring layer BEOL may include a plurality of wiring patterns ML1, ML2, . . . , MLx-1, and MLx at different vertical levels, a plurality of wiring vias MV1, . . . , and MVy at different vertical levels, and an inter-wire insulation layer IMD surrounding the wiring patterns ML1, ML2, . . . , MLx-1, and MLx and the wiring vias MV1, . . . , and MVy. The wiring patterns ML1, ML2, . . . , MLx-1, and MLx may be the second wiring patterns 222 shown in FIG. 1, and the wiring vias MV1, . . . , and MVy may be the second wiring vias 224 shown in FIG. 1.

In an example embodiment, the inter-wire insulation layer IMD may include tetraethyl orthosilicate (TEOS). In another example embodiment, the inter-wire insulation layer IMD may include an insulating material having a lower dielectric constant than that of silicon oxide. For example, the inter-wire insulation layer IMD may include an ultra low k (ULK) film having an ultra low dielectric constant K from about 2.2 to about 2.4. The ULK film may include an SiOC film or a SiCOH film. The inter-wire insulation layer IMD may have a multilayered structure in which a plurality of insulation layers are stacked.

The front surface protecting layer FPSV having a plurality of front surface openings PVO may be formed on the topmost wiring pattern MLx farthest from the upper semiconductor substrate Sub-U from among the wiring patterns ML1, ML2, . . . , MLx-1, and MLx. The front surface openings PVO may be filled with the signal vias PVA-S in the signal region SR, and the front surface openings PVO may be filled with the thermal vias PVA-T in the thermal region TR. The signal vias PVA-S and the thermal vias PVA-T may be formed together from the same material. In an example embodiment, the signal vias PVA-S and the thermal via PVA-T may each include a material that is similar to or the same as that of the first wiring structure 120 described above with reference to FIG. 1. In another example embodiment, the signal vias PVA-S and the thermal vias PVA-T may each include a material that is similar to or the same as that of a conductive pillars PIL or may be integrally formed with the conductive pillars PIL.

The signal via PVA-S may have a first horizontal width W1, and the thermal via PVA-T may have a second horizontal width W2. For example, the first horizontal width W1 and the second horizontal width W2 may each have a value from about 3 μm to about 10 μm. In an example embodiment, the first horizontal width W1 and the second horizontal width W2 may have the same value.

The signal bump BMP-S may be attached onto the signal via PVA-S, and the thermal bump BMP-T may be attached onto the thermal via PVA-T. The signal bumps BMP-S and the thermal bumps PVA-S may be the signal bumps 260S and the thermal bumps 260T shown in FIG. 1, respectively. The signal bumps BMP-S may be arranged in the signal region SR, and the thermal bumps BMP-T may be arranged in the thermal region TR.

In an example embodiment, the signal bumps BMP-S and the thermal bumps BMP-T may have the same configuration except that they are respectively arranged in the signal regions SR and thermal regions TR. The signal bumps BMP-S and the thermal bumps BMP-T may each include the conductive pillar PIL contacting the signal via PVA-S or the thermal via PVA-T and a conductive cap SLD covering the top of the conductive pillar PIL. The conductive cap SLD of the signal bump BMP-S may be between the conductive pillar PIL of the signal bump BMP-S and the rear surface signal pad BPD-S, and the conductive cap SLD of the thermal bump BMP-T may be between the conductive pillar PIL of the thermal bump BMP-T and the rear surface thermal pad BPD-T. The conductive pillar PIL may have a thickness from about 3 μm to about 5 μm and a horizontal width from about 10 μm to about 20 μm. The conductive cap SLD may have a thickness from about 10 μm to about 15 μm and a horizontal width from about 15 μm to about 25 The conductive pillar PIL may include, e.g., at least one of nickel, copper, titanium, palladium, platinum, and gold. In an example embodiment, the conductive pillar PIL may include nickel. In another example embodiment, the conductive pillar PIL may be a multilayered structure including a barrier layer, a seed layer, and a base pillar layer. For example, the barrier layer, the seed layer, and the base pillar layer may include titanium, copper, and nickel, respectively. The conductive cap SLD may include, e.g., at least one of tin (Sn), indium (In), bismuth (Bi), antimony (Sb), copper (Cu), silver (Ag), gold (Au), zinc (Zn), and lead (Pb).

The rear surface signal pad BPD-S and the rear surface thermal pad BPD-T may have the same configuration except that they are respectively arranged in the signal region SR and the thermal region TR. The rear surface signal pad BPD-S and the rear surface thermal pad BPD-T may have a thickness from about 2 μm to about 4 μm and a horizontal width from about 15 μm to about 25 μm. The rear surface signal pad BPD-S and the rear surface thermal pad BPD-T may include, e.g., at least one of nickel, copper, titanium, palladium, platinum, and gold. In an example embodiment, the rear surface signal pad BPD-S and the rear surface thermal pad BPD-T may include nickel.

Between the upper semiconductor chip SL-U and the lower semiconductor chip SL-L, an insulating adhesive layer ADL, which surrounds the signal bump BMP-S and the thermal bump BMP-T and fills the gap between the upper semiconductor chip SL-U and the lower semiconductor chip SL-L, may be provided. The insulating adhesive layer ADL may be the insulating adhesive layer 350 shown in FIG. 1.

In the semiconductor package 10 according to the present example embodiment, the thermal bump BMP-T may be connected to the topmost wiring pattern MLx through the thermal via PVA-T, and thus heat generated inside the upper semiconductor chip SL-U may be smoothly dissipated to the outside of the upper semiconductor chip SL-U through the thermal bump BMP-T. Also, because the thermal bump BMP-T contacts the rear surface thermal pad BPD-T, heat generated inside the upper semiconductor chip SL-U may be transferred to the lower semiconductor chip SL-L through the thermal bump BMP-T and the rear surface thermal pad BPD-T.

The thermal bump BMP-T may be connected to the topmost via wiring pattern MLx connected to the upper via electrode TSV-U and the signal bump BMP-S through the thermal via PVA-T, and thus heat generated inside the upper semiconductor chip SL-U may be smoothly dissipated to the outside. The rear surface thermal pad BPD-T contacting the thermal bump BMP-T may be separated and electrically insulated from the lower via electrode TSV-L and the lower semiconductor substrate Sub-L by the rear surface protecting layer BPSV, and thus the thermal bump BMP-T connected to the topmost wiring pattern MLx may prevent electrical interference between the upper semiconductor chip SL-U and the lower semiconductor chip SL-L.

Figure 3B:
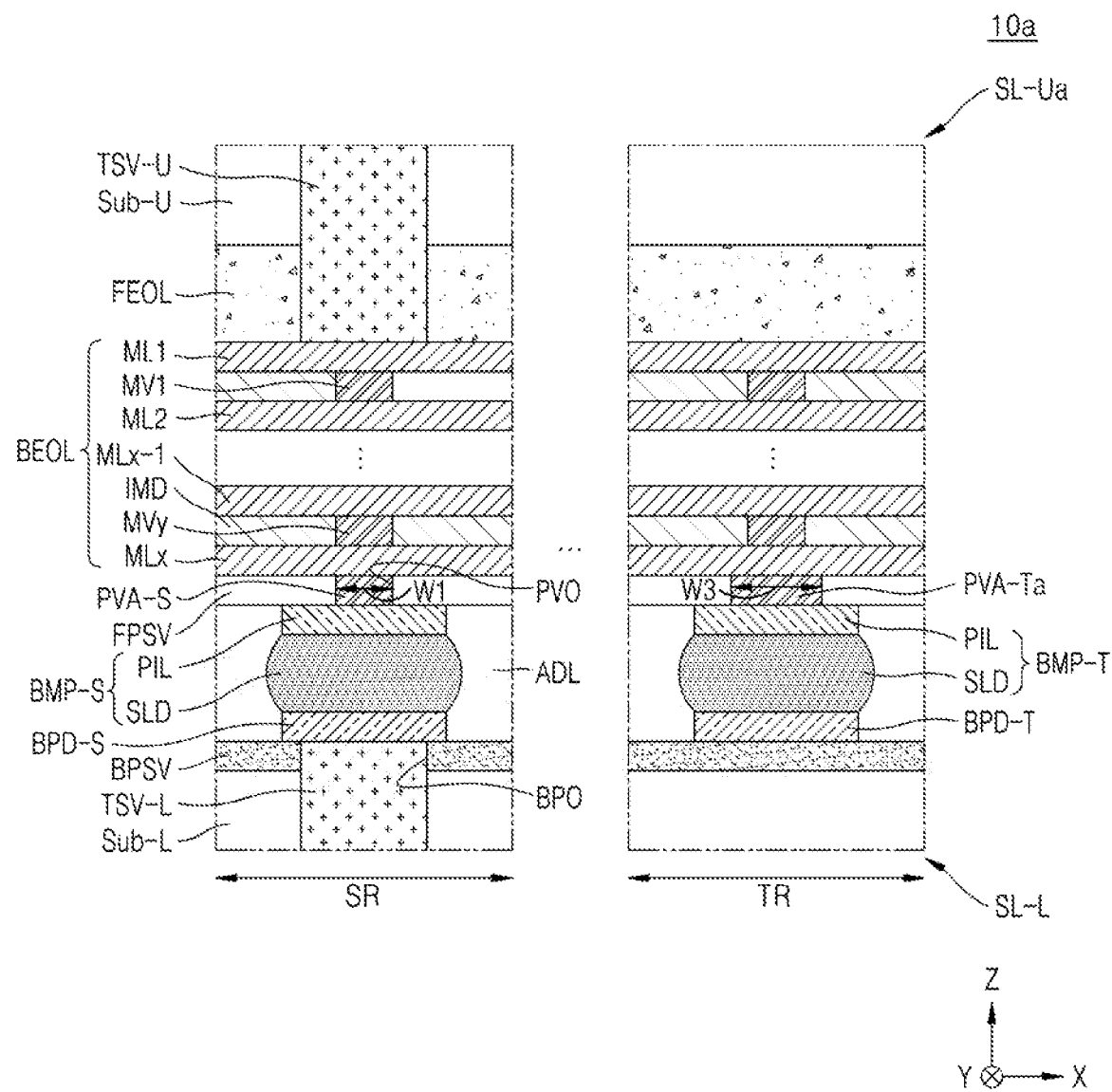

Referring to FIG. 3B, a semiconductor package 10a according to an example embodiment may include an upper semiconductor chip SL-Ua and the lower semiconductor chip SL-L. The upper semiconductor chip SL-Ua may be any one of the second semiconductor chips 200 shown in FIG. 1. The lower semiconductor chip SL-L may be any one of the second semiconductor chips 200 shown in FIG. 1 (other than the topmost second semiconductor chip 200) and may be below the upper semiconductor chip SL-Ua.

The upper semiconductor chip SL-Ua may include the signal via PVA-S and a thermal via PVA-Ta. The signal via PVA-S and the thermal via PVA-Ta may be the connecting vias 245 shown in FIG. 1. The signal via PVA-S may have the first horizontal width W1, and the thermal via PVA-Ta may have a third horizontal width W3. For example, the first horizontal width W1 may have a value from about 3 µm to about 10 µm, and the third horizontal width W3 may have a value from about 5 µm to about 12 µm. In an example embodiment, the third horizontal width W3 may have a value greater than the first horizontal width W1.

In the semiconductor package 10a according to the present example embodiment, the thermal via PVA-Ta contacting the thermal bump BMP-Ta may have a greater horizontal width than the signal via PVA-S contacting the signal bump BMP-S, and thus heat generated inside the upper semiconductor package SL-Ua may be transferred to the outside of the semiconductor package SL-U and the lower semiconductor package SL-L through the thermal bump BMP-Ta.

Figure 3C:
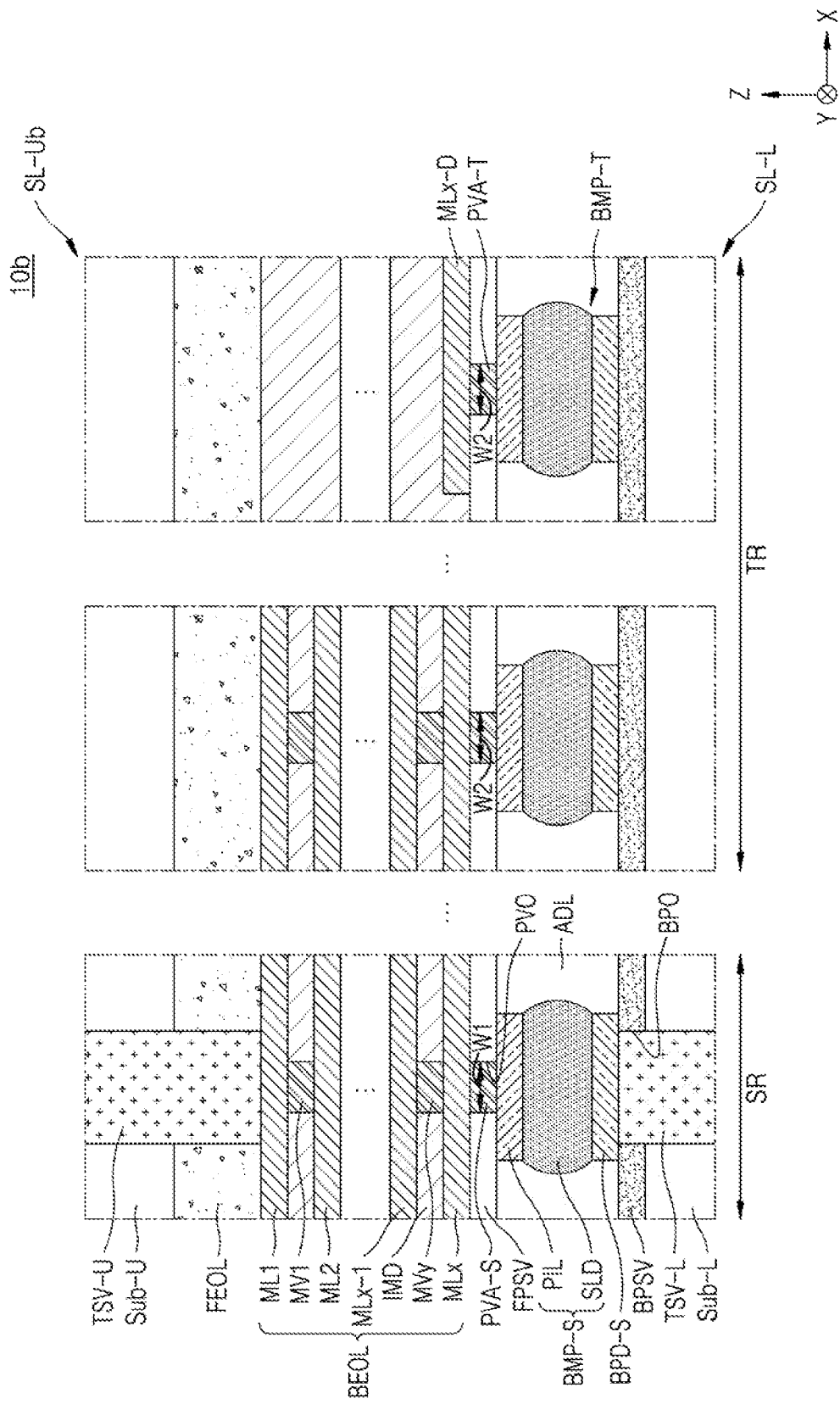

Referring to FIG. 3C, a semiconductor package 10b according to an example embodiment may include an upper semiconductor chip SL-Ub and the lower semiconductor chip SL-L. The upper semiconductor chip SL-Ub may be any one of the second semiconductor chips 200 shown in FIG. 1, and the lower semiconductor chip SL-L may be any one of the second semiconductor chips 200 shown in FIG. 1 (other than the topmost second semiconductor chip 200) and may be below the upper semiconductor chip SL-Ub.

The upper semiconductor chip SL-Ub may further include a dummy wiring pattern MLx-D located at the same vertical level as the topmost wiring pattern MLx. The dummy wiring pattern MLx-D may not be electrically connected to the device layer FEOL, the upper via electrode TSV-U, the signal via PVA-S, and the signal bump BMP-S. Some of the thermal bumps BMP-T may be connected to the topmost wiring pattern MLx through thermal vias PVA-T, and the others of the thermal bumps BMP-T may be connected to dummy wiring pattern MLx-D through the thermal vias PVA-T.

In the semiconductor package 10b according to the present example embodiment, the dummy wiring pattern MLx-D may be provided in a portion of the upper semiconductor chip SL-Ub without the topmost wiring pattern MLx, and the dummy wiring pattern MLx-D and the thermal bump BMP-T may be connected through the thermal via PVA-T, and thus heat generated inside the upper semiconductor package SL-Ub may be efficiently transferred to the outside of the upper semiconductor chip SL-Ub and the lower semiconductor chip SL-L through the thermal bump BMP-T.

Figure 3D:
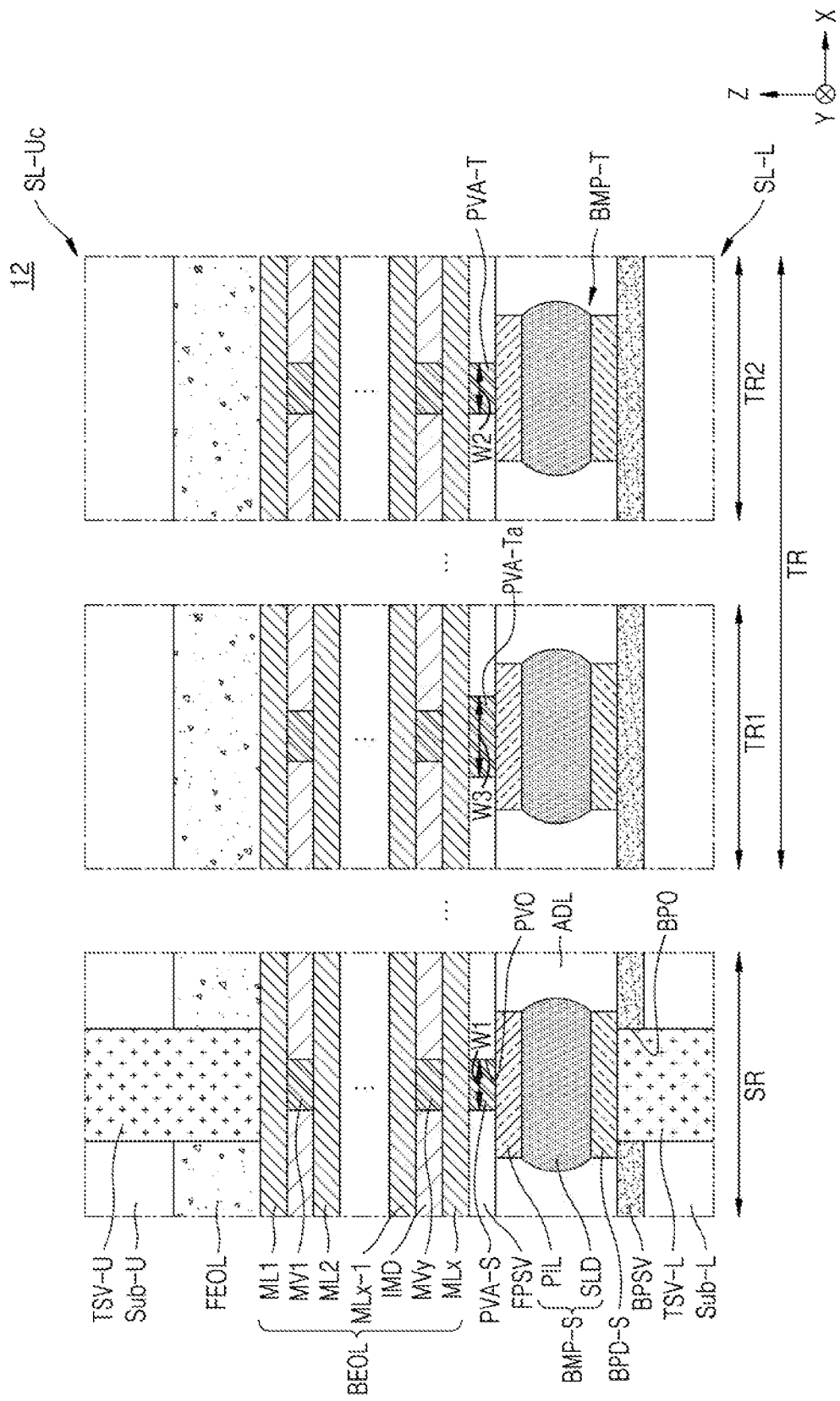

Referring to FIG. 3D, a semiconductor package 12 according to an example embodiment may include an upper semiconductor chip SL-Uc and the lower semiconductor chip SL-L. The upper semiconductor chip SL-Uc may be any one of the second semiconductor chips 200 shown in FIG. 1, and the lower semiconductor chip SL-L may be any one of the second semiconductor chips 200 shown in FIG. 1 (other than the topmost second semiconductor chip 200) and may be below the upper semiconductor chip SL-Uc.

The upper semiconductor chip SL-Uc may include the signal region SR and the thermal region TR. The thermal region TR may include a first thermal region TR1 and a second thermal region TR2. The upper semiconductor chip SL-Uc may include a first thermal via PVA-Ta provided in the first thermal region TR1 and a second thermal via PVA-T provided in the second thermal region TR2. The first thermal via PVA-Ta may be similar to or the same as the thermal via PVA-Ta shown in FIG. 3B, and the second thermal via PVA-T may be similar to or the same as the thermal via PVA-T shown in FIG. 3A.

The signal via PVA-S, the first thermal via PVA-Ta, and the second thermal via PVA-T may be connecting vias 245 shown in FIG. 1. The signal via PVA-S may have the first horizontal width W1, the first thermal via PVA-Ta may have the third horizontal width W3, and the second thermal via PVA-T may have the second horizontal width W2. For example, the first horizontal width W1 and the second horizontal width W2 may each have a value from about 3 µm to about 10 µm, and the third horizontal width W3 may have a value from about 5 µm to about 12 µm. In an example embodiment, the third horizontal width W3 may have a value greater than that of the first horizontal width W1, and the second horizontal width W2 may have a value smaller than that of the third horizontal width W3. In an example embodiment, the first horizontal width W1 and the second horizontal width W2 may have the same value.

In the upper semiconductor chip SL-Uc, the first thermal region TR1 may be a region that generates relatively more heat than the second thermal region TR2. In an example embodiment, when viewed from above, the first thermal region TR1 may be adjacent to the signal region SR, which is the center of the upper semiconductor chip SL-Uc, and the second thermal region TR2 may be relatively close to the edges of the upper semiconductor chip SL-UG as compared to the first thermal region TR1.

In the semiconductor package 12 according to the present example embodiment, the thermal bump BMP-T provided in the first thermal region TR1 generating a relatively large amount of heat may be connected to the first thermal via PVA-Ta, and the thermal bump BMP-T provided in the first thermal region TR1 generating a relatively small amount of heat may be connected to the second thermal via PVA-T. In the upper semiconductor chip SL-Ua, the third horizontal width W3 of the first thermal via PVA-Ta, which is provided in a region generating a relatively large amount of heat, is greater than the second horizontal width W2 of the second thermal via PVA-T, which is provided in a region generating a relatively small amount of heat, and thus heat generated inside the upper semiconductor chip SL-Ua may be smoothly transferred to the outside of the upper semiconductor chip SL-Ua and the lower semiconductor chip SL-L.

FIGS. 4A to 4D are partial plan views of an upper semiconductor chip included in a semiconductor package according to example embodiments, as viewed from below.

Figure 4A:
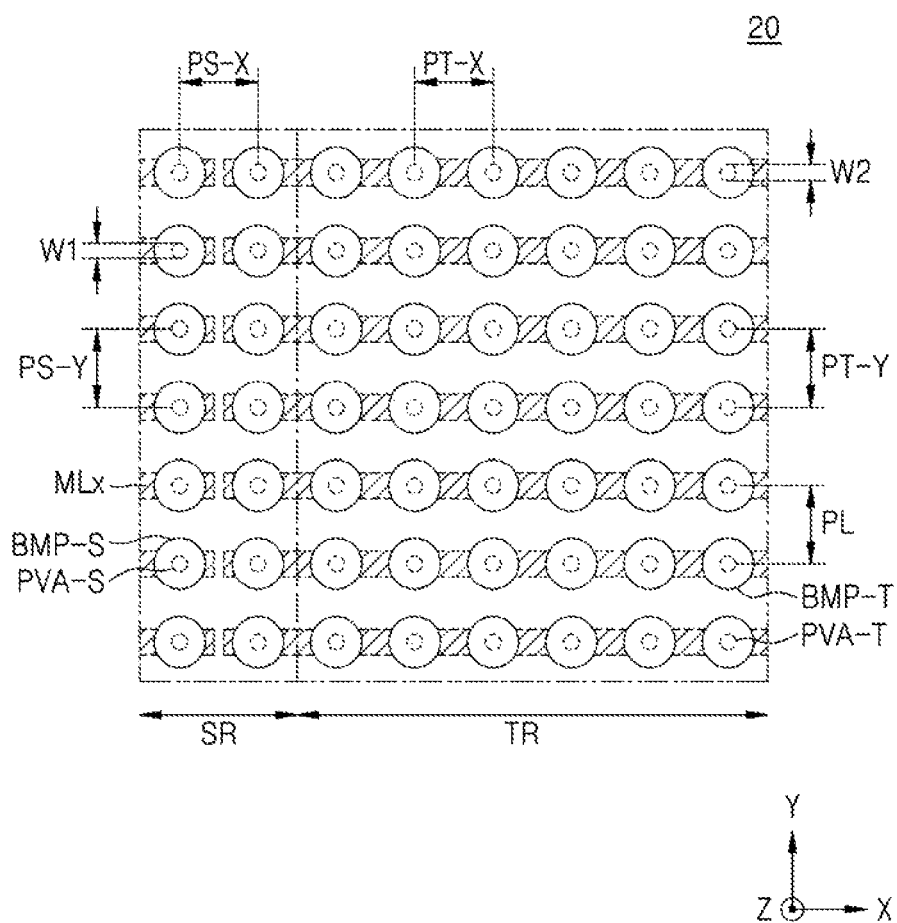
FIGS. 4A to 4D are partial plan views of an upper semiconductor chip included in a semiconductor package according to example embodiments, as viewed from below.

Referring to FIG. 4A, an upper semiconductor chip 20 according to an example embodiment may include the signal region SR and the thermal region TR. The upper semiconductor chip 20 may be the second semiconductor chip 200 shown in FIG. 1.

A plurality of topmost wiring patterns MLx may have a wiring pitch PL and extend in a horizontal direction. Although FIG. 4A shows that the topmost wiring patterns MLx have the wiring pitch PL in the second horizontal direction (Y direction) and extend in the first horizontal direction (X direction), the topmost wiring patterns MLx may extend in the first horizontal direction (X direction) or may extend in the second direction (Y direction). In an implementation, some of the topmost wiring patterns MLx may extend in the first horizontal direction (X direction) and the others may extend in the second horizontal direction (Y direction). The wiring pitch PL may be, e.g., from about 20 µm to about 40 µm.

In the signal region SR, the signal bumps BMP-S may form a matrix having a first pitch PS-X in the first horizontal direction (X direction) and having a second pitch PS-Y in the second horizontal direction (Y direction). For example, the first pitch PS-X and the second pitch PS-Y may each be from about 20 µm to about 40 µm.

In the thermal region TR, the thermal bumps BMP-T may form a matrix having a third pitch PT-X in the first horizontal direction (X direction) and having a fourth pitch PT-Y in the second horizontal direction (Y direction). For example, the third pitch PT-X and the fourth pitch PT-Y may each be from about 20 µm to about 40 µm.

In an example embodiment, the first pitch PS-X and the third pitch PT-X may have the same value. In an example embodiment, the second pitch PS-Y and the fourth pitch PT-Y may have the same value. In an example embodiment, the first pitch PS-X and the second pitch PS-Y may have the same value. In an example embodiment, the third pitch PT-X and the fourth pitch PT-Y may have the same value. In an example embodiment, the first pitch PS-X and the third pitch PT-X may have the same values as the wiring pitch PL, or the second pitch PS-Y and the fourth pitch PT-Y may have the same values as the wiring pitch PL.

The signal via PVA-S connected to the signal bump BMP-S may have the first horizontal width W1, and the thermal via PVA-T connected to the thermal bump BMP-T may have the second horizontal width W2. For example, the first horizontal width W1 and the second horizontal width W2 may each have a value from about 3 µm to about 10 In an example embodiment, the first horizontal width W1 and the second horizontal width W2 may have the same value.

Figure 4B:
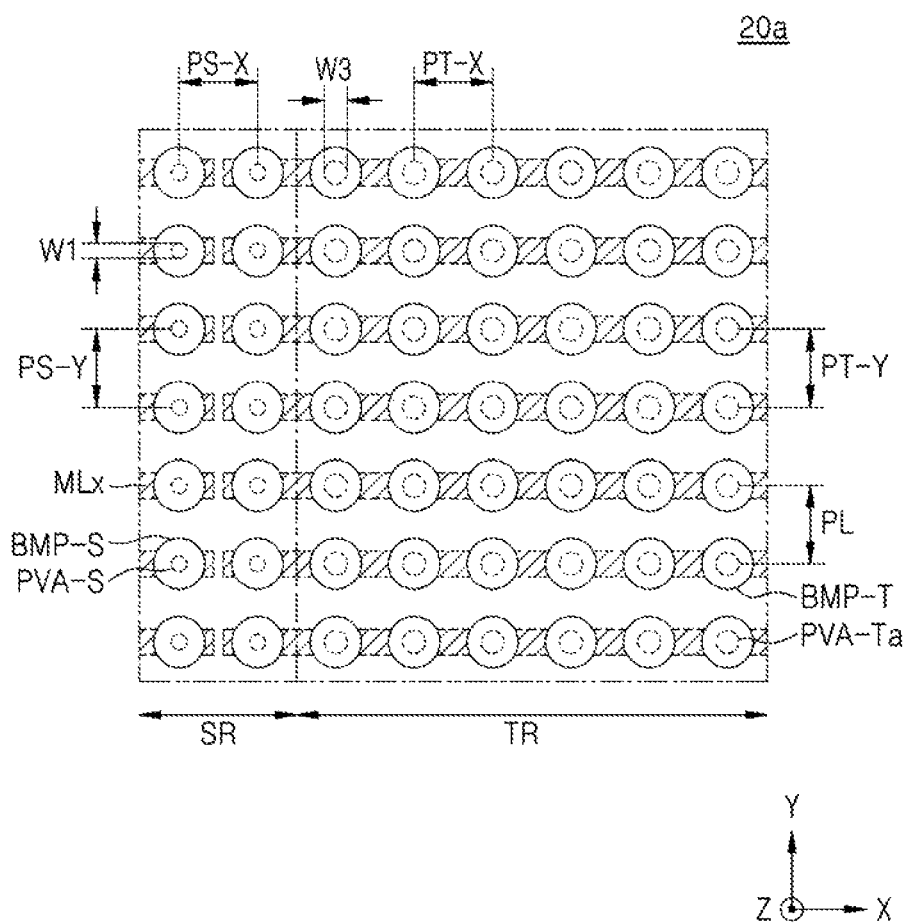

Referring to FIG. 4B, an upper semiconductor chip 20a according to an example embodiment may include the signal region SR and the thermal region TR. The upper semiconductor chip 20a may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the thermal region TR, thermal bumps BMP-Ta may form a matrix having a third pitch PT-X in the first horizontal direction (X direction) and having a fourth pitch PT-Y in the second horizontal direction (Y direction).

The signal via PVA-S connected to the signal bump BMP-S may have the first horizontal width W1, and the thermal via PVA-Ta connected to the thermal bump BMP-Ta may have the third horizontal width W3. For example, the first horizontal width W1 may have a value from about 3 µm to about 10 and the third horizontal width W3 may have a value from about 5 µm to about 12 In an example embodiment, the third horizontal width W3 may have a value greater than the first horizontal width W1.

Figure 4C:
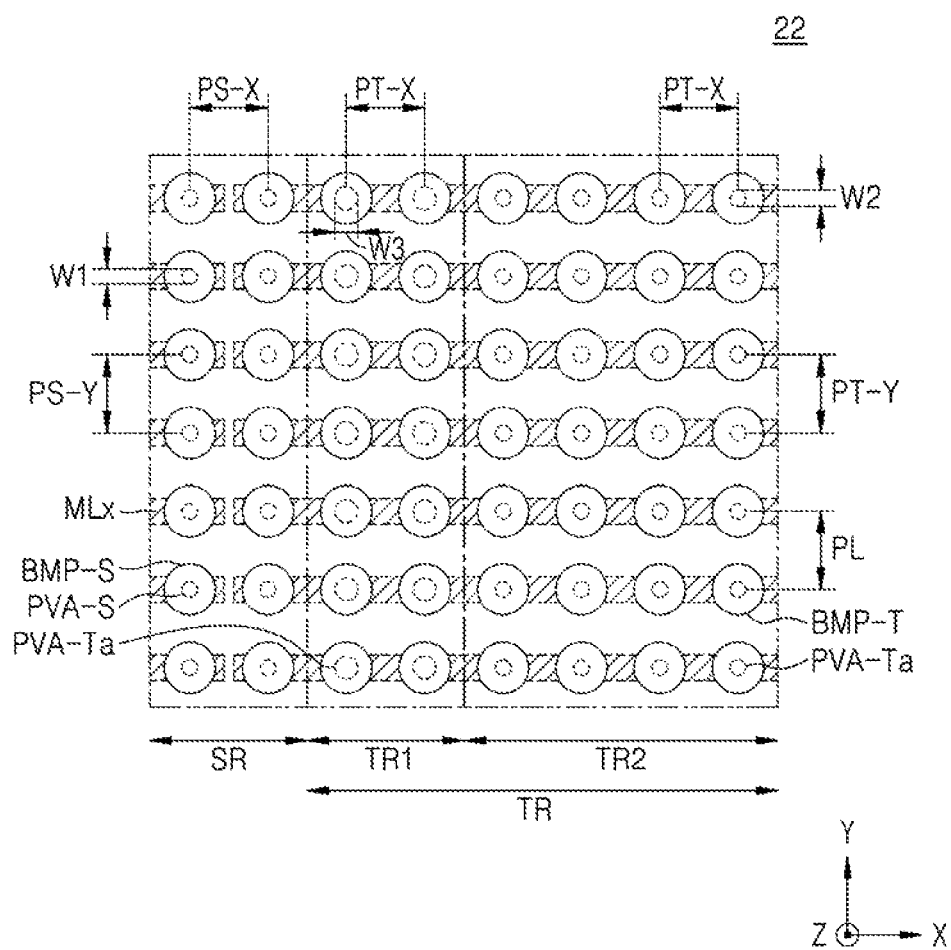

Referring to FIG. 4C, an upper semiconductor chip 22 according to an example embodiment may include the signal region SR and the thermal region TR. The thermal region TR may include a first thermal region TR1 and a second thermal region TR2. The upper semiconductor chip 22 may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the first thermal region TR1 and the second thermal region TR2, the thermal bumps BMP-T may form a matrix having the third pitch PT-X in the first horizontal direction (X direction) and having the fourth pitch PT-Y in the second horizontal direction (Y direction).

The signal via PVA-S connected to the signal bump BMP-S may have the first horizontal width W1, the thermal via PVA-Ta connected to the thermal bump BMP-T in the first thermal region TR1 may have the third horizontal width W3, and the thermal via PVA-T connected to the thermal bump BMP-Ta in the second thermal region TR2 may have the second horizontal width W2. For example, the first horizontal width W1 may have a value from about 3 µm to about 10 the second horizontal width W2 may each have a value from about 3 µm to about 10 and the third horizontal width W3 may have a value from about 5 µm to about 12 In an example embodiment, the third horizontal width W3 may have a value greater than that of the first horizontal width W1, and the second horizontal width W2 may have a value smaller than that of the third horizontal width W3. In an example embodiment, the first horizontal width W1 and the second horizontal width W2 may have the same value.

Figure 4D:
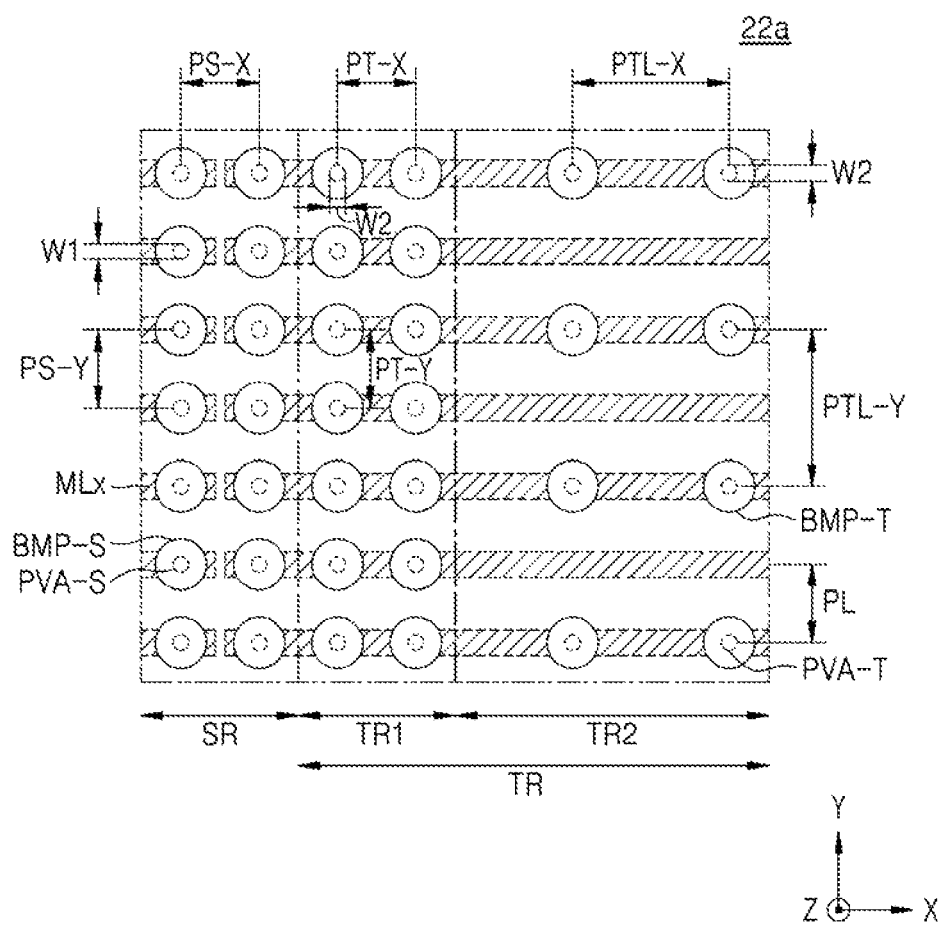

Referring to FIG. 4D, an upper semiconductor chip 22a according to an example embodiment may include the signal region SR and the thermal region TR. The thermal region TR may include a first thermal region TR1 and a second thermal region TR2. The upper semiconductor chip 22a may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the first thermal region TR1, the thermal bumps BMP-T may form a matrix having a third pitch PT-X in the first horizontal direction (X direction) and having a fourth pitch PT-Y in the second horizontal direction (Y direction). In the second thermal region TR2, the thermal bumps BMP-T may form a matrix having a fifth pitch PTL-X in the first horizontal direction (X direction) and having a sixth pitch PTL-Y in the second horizontal direction (Y direction).

The fifth pitch PTL-X may have a greater value than the third pitch PT-X, and the sixth pitch PTL-Y may have a greater value than the fourth pitch PT-Y. In an example embodiment, the fifth pitch PTL-X may be an 2, 3, or greater integer multiple of the third pitch PT-X, and the sixth pitch PTL-Y may be an integer multiple of 2 or 3 times greater than the fourth pitch PT-Y. In an example embodiment, the fifth pitch PTL-X may be an 2, 3, or greater integer multiple of the wiring pitch PL, or the sixth pitch PTL-Y may be an integer multiple of 2 or 3 times greater than the wiring pitch PL.

The signal via PVA-S connected to the signal bump BMP-S may have the first horizontal width W1, and the thermal via PVA-T connected to the thermal bump BMP-T may have the second horizontal width W2. For example, the first horizontal width W1 and the second horizontal width W2 may each have a value from about 3 µm to about 10 In an example embodiment, the first horizontal width W1 and the second horizontal width W2 may have the same value.

FIGS. 5A to 5D are partial plan views of an upper semiconductor chip included in a semiconductor package according to example embodiments, as viewed from below.

Referring to FIG. 5A, an upper semiconductor chip 20*b* according to an example embodiment may include the signal region SR and the thermal region TR. The upper semiconductor chip 20*b* may be the second semiconductor chip 200 shown in FIG. 1.

A plurality of topmost wiring patterns MLx may have a wiring pitch PL and extend in a horizontal direction.

In the signal region SR, the signal bumps BMP-S may form a matrix having a first pitch PS-X in the first horizontal direction (X direction) and having a second pitch PS-Y in the second horizontal direction (Y direction). For example, the first pitch PS-X and the second pitch PS-Y may each be from about 20 µm to about 40 µm.

In the thermal region TR, the thermal bumps BMP-T may form a matrix having a third pitch PTa-X in the first horizontal direction (X direction) and having a fourth pitch PTa-Y in the second horizontal direction (Y direction). For example, the third pitch PTa-X and the fourth pitch PTa-Y may each be from about 40 µm to about 80 µm.

In an example embodiment, the third pitch PTa-X may be an 2, 3, or greater integer multiple of the first pitch PS-X. In an example embodiment, the fourth pitch PTa-Y may be an 2, 3, or greater integer multiple of the second pitch PS-Y. In an example embodiment, the third pitch PTa-X and the fourth pitch PTa-Y may have the same value. For example, the third pitch PTa-X may have a value greater than the fourth pitch PTa-Y. In an implementation, e.g., the fourth pitch PTa-Y may have a value greater than the third pitch PTa-X.

The signal via PVA-S connected to the signal bump BMP-S may have the first horizontal width W1, and the thermal via PVA-T connected to the thermal bump BMP-T may have the second horizontal width W2. In an example embodiment, the first horizontal width W1 and the second horizontal width W2 may have the same value.

Figure 5B:
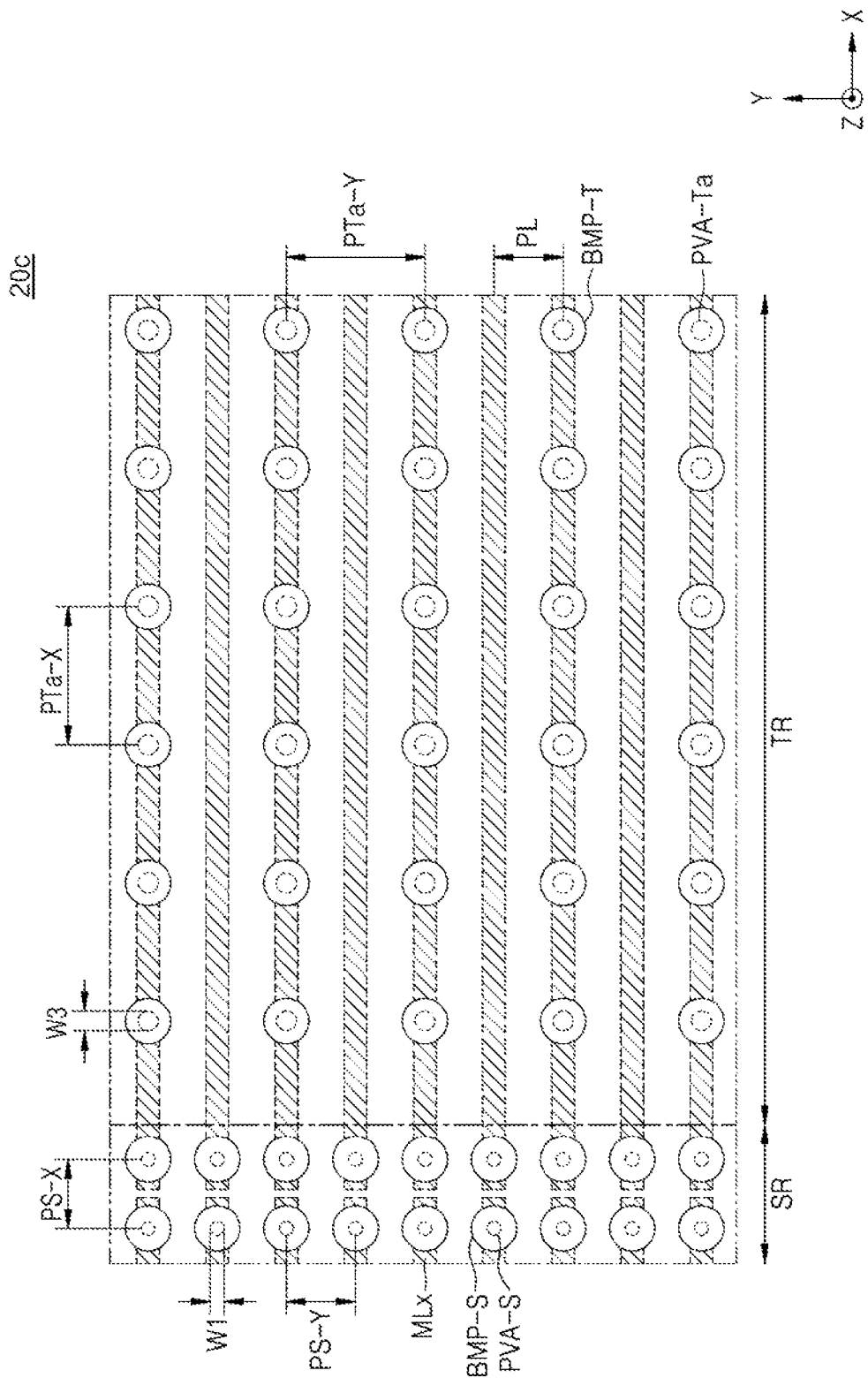

Referring to FIG. 5B, an upper semiconductor chip 20*c* according to an example embodiment may include the signal region SR and the thermal region TR. The upper semiconductor chip 20*c* may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the thermal region TR, the thermal bumps BMP-T may form a matrix having a third pitch PTa-X in the first horizontal direction (X direction) and having a fourth pitch PTa-Y in the second horizontal direction (Y direction).

The signal via PVA-S connected to the signal bump BMP-S may have the first horizontal width W1, and the thermal via PVA-Ta connected to the thermal bump BMP-Ta may have the third horizontal width W3. In an example embodiment, the third horizontal width W3 may have a value greater than the first horizontal width W1.

Figure 5C:
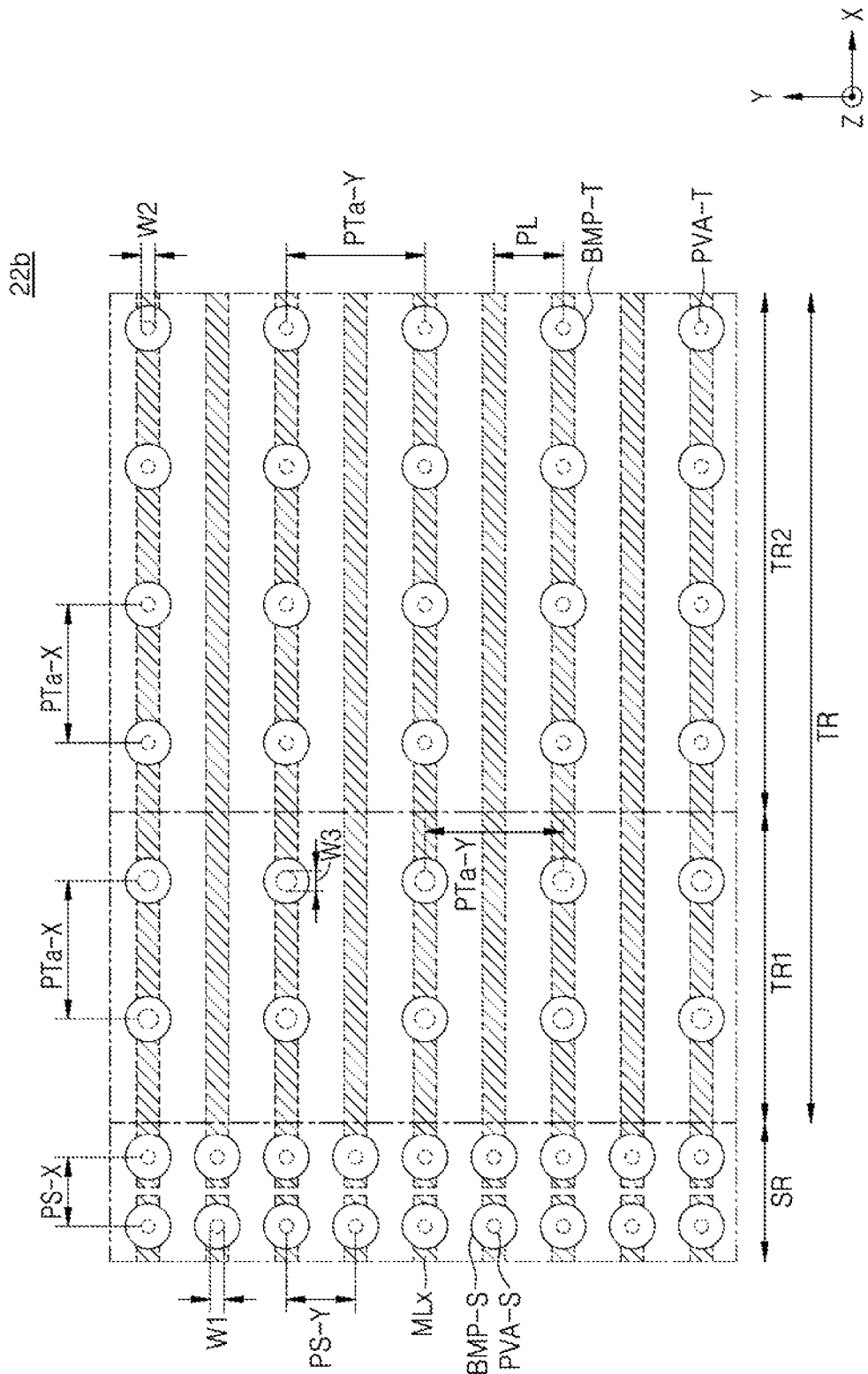

Referring to FIG. 5C, an upper semiconductor chip 22*b* according to an example embodiment may include the signal region SR and the thermal region TR. The thermal region TR may include a first thermal region TR1 and a second thermal region TR2. The upper semiconductor chip 22*b* may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the first thermal region TR1 and the second thermal region TR2, the thermal bumps BMP-T may form a matrix having the third pitch PTa-X in the first horizontal direction (X direction) and having the fourth pitch PTa-Y in the second horizontal direction (Y direction).

The signal via PVA-S connected to the signal bump BMP-S may have the first horizontal width W1, the thermal via PVA-Ta connected to the thermal bump BMP-T in the first thermal region TR1 may have the third horizontal width W3, and the thermal via PVA-T connected to the thermal bump BMP-Ta in the second thermal region TR2 may have the second horizontal width W2. In an example embodiment, the third horizontal width W3 may have a value greater than that of the first horizontal width W1, and the second horizontal width W2 may have a value smaller than that of the third horizontal width W3. In an example embodiment, the first horizontal width W1 and the second horizontal width W2 may have the same value.

Referring to FIG. 5D, an upper semiconductor chip 22*c* according to an example embodiment may include the signal region SR and the thermal region TR. The thermal region TR may include a first thermal region TR1 and a second thermal region TR2. The upper semiconductor chip 22*c* may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the first thermal region TR1, the thermal bumps BMP-T may form a matrix having the third pitch PTa-X in the first horizontal direction (X direction) and having the fourth pitch PTa-Y in the second horizontal direction (Y direction). In the second thermal region TR2, the thermal bumps BMP-T may form a matrix having a fifth pitch PTLa-X in the first horizontal direction (X direction) and having a sixth pitch PTLa-Y in the second horizontal direction (Y direction).

The fifth pitch PTLa-X may have a greater value than the third pitch PTa-X, and the sixth pitch PTLa-Y may have a greater value than the fourth pitch PTa-Y. In an example embodiment, the fifth pitch PTLa-X may be an 2, 3, or greater integer multiple of the third pitch PTa-X, and the sixth pitch PTLa-Y may be an integer multiple of 2 or 3 times greater than the fourth pitch PTa-Y. In an example embodiment, the third pitch PTa-X may be an 2, 3, or greater integer multiple of the wiring pitch PL, or the fourth pitch PTa-Y may be an integer multiple of 2 or 3 times greater than the wiring pitch PL.

The signal via PVA-S connected to the signal bump BMP-S may have the first horizontal width W1, and the thermal via PVA-T connected to the thermal bump BMP-T may have the second horizontal width W2.

FIGS. 6A to 6D are partial plan views of an upper semiconductor chip included in a semiconductor package according to example embodiments, as viewed from below.

Figure 6A:
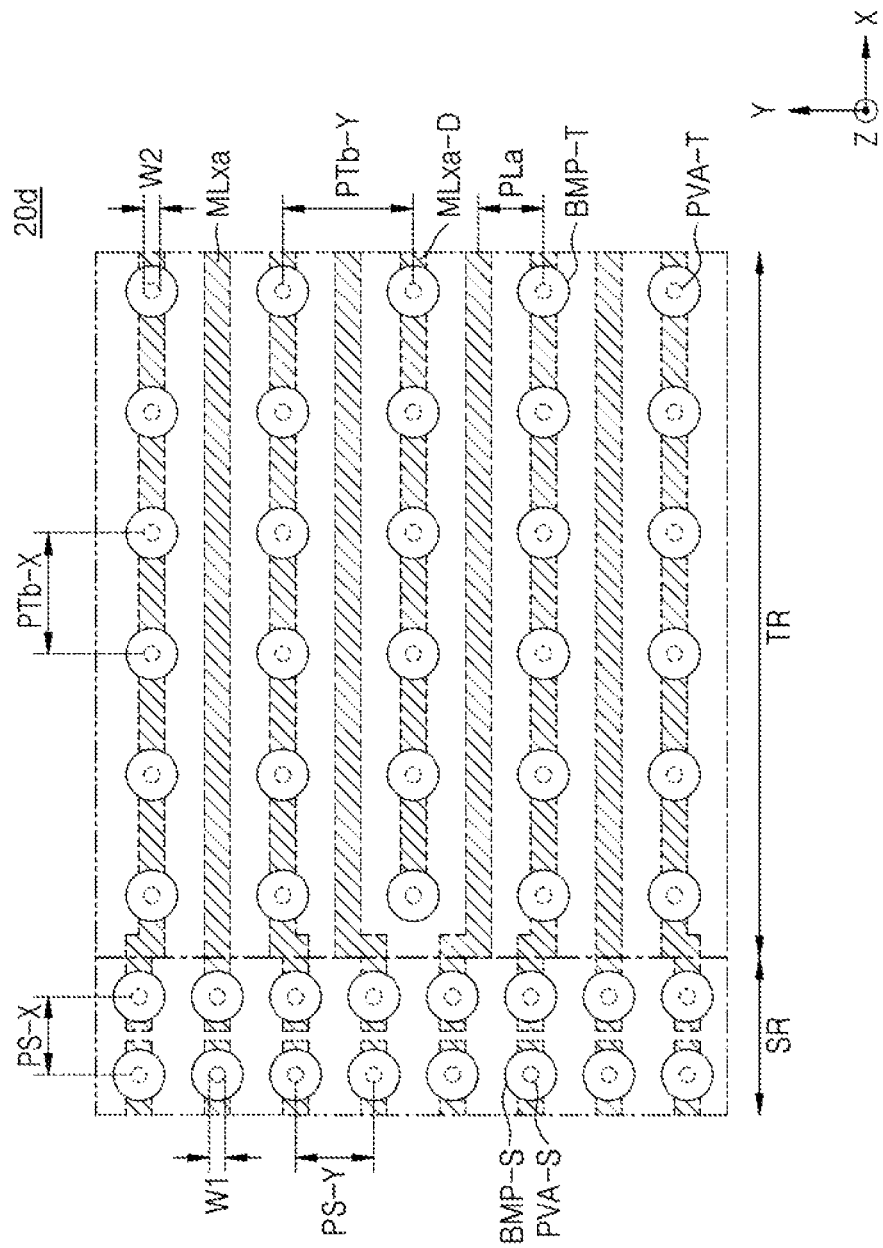
FIGS. 6A to 6D are partial plan views of an upper semiconductor chip included in a semiconductor package according to example embodiments, as viewed from below.

Referring to FIG. 6A, an upper semiconductor chip 20d according to an example embodiment may include the signal region SR and the thermal region TR. The upper semiconductor chip 20d may be the second semiconductor chip 200 shown in FIG. 1.

A plurality of topmost wiring patterns MLxa may have a wiring pitch PLa and extend in a horizontal direction. The upper semiconductor chip 20d may further include at least one dummy wiring pattern MLxa-D located at the same vertical level as the topmost wiring pattern MLxa. The topmost wiring patterns MLxa and the dummy wiring pattern MLxa-D may be the topmost wiring patterns MLx and the dummy wiring pattern MLx-D shown in FIG. 3C. Some of the thermal bumps BMP-T may be connected to the topmost wiring pattern MLxa through thermal vias PVA-T, and the others of the thermal bumps BMP-T may be connected to dummy wiring pattern MLxa-D through the thermal vias PVA-T.

In the signal region SR, the signal bumps BMP-S may form a matrix having a first pitch PS-X in the first horizontal direction (X direction) and having a second pitch PS-Y in the second horizontal direction (Y direction). For example, the first pitch PS-X and the second pitch PS-Y may each be from about 20 μm to about 40 μm.

In the thermal region TR, the thermal bumps BMP-T may form a matrix having a third pitch PTb-X in the first horizontal direction (X direction) and having a fourth pitch PTb-Y in the second horizontal direction (Y direction). For example, the third pitch PTb-X and the fourth pitch PTb-Y may each be from about 30 μm to about 60 μm.

In an example embodiment, the third pitch PTb-X may have a value greater than the first pitch PS-X. In an example embodiment, the fourth pitch PTb-Y may have a value greater than the second pitch PS-Y. In an example embodiment, the third pitch PTb-X and the fourth pitch PTb-Y may have the same value. In an example embodiment, the first pitch PS-X and the third pitch PTb-X may have different values from a wiring pitch PLa. For example, the first pitch PS-X and the third pitch PTb-X may have values greater than the wiring pitch PLa. In an example embodiment, the third pitch PTb-X may be an 2, 3, or greater integer multiple of the wiring pitch PL, or the fourth pitch PTb-Y may be an integer multiple of 2 or 3 times greater than the wiring pitch PL.

The signal via PVA-S connected to the signal bump BMP-S may have the first horizontal width W1, and the thermal via PVA-T connected to the thermal bump BMP-T may have the second horizontal width W2. In an example embodiment, the first horizontal width W1 and the second horizontal width W2 may have the same value.

Figure 6B:
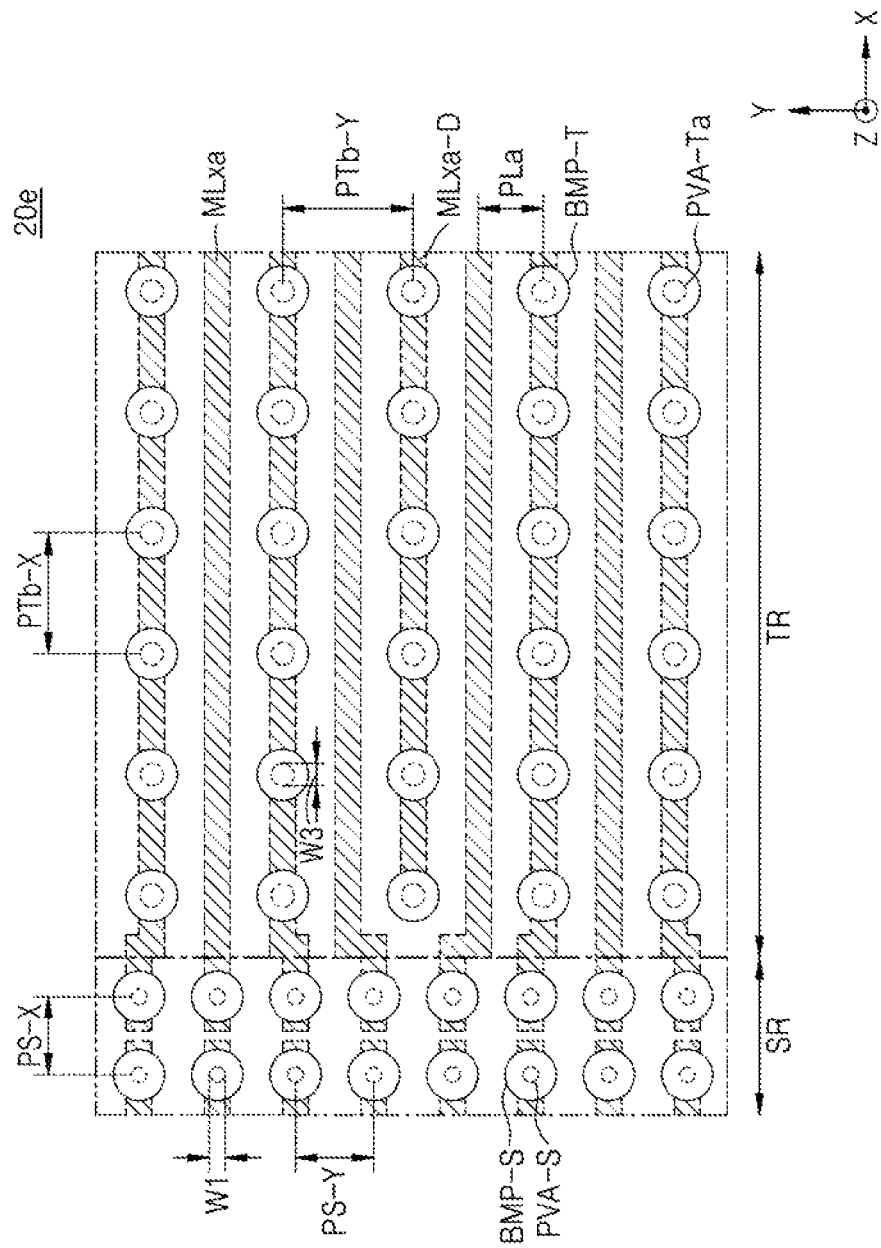

Referring to FIG. 6B, an upper semiconductor chip 20e according to an example embodiment may include the signal region SR and the thermal region TR. The upper semiconductor chip 20e may be the second semiconductor chip 200 shown in FIG. 1.

A plurality of topmost wiring patterns MLxa may have a wiring pitch PLa and extend in a horizontal direction. The upper semiconductor chip 20d may further include at least one dummy wiring pattern MLxa-D located at the same vertical level as the topmost wiring pattern MLxa. The topmost wiring patterns MLxa and the dummy wiring pattern MLxa-D may be the topmost wiring patterns MLx and the dummy wiring pattern MLx-D shown in FIG. 3C. Some of the thermal bumps BMP-T may be connected to the topmost wiring pattern MLxa through thermal vias PVA-Ta, and the others of the thermal bumps BMP-T may be connected to dummy wiring pattern MLxa-D through the thermal vias PVA-Ta.

In the signal region SR, the signal bumps BMP-S may form a matrix having a first pitch PS-X in the first horizontal direction (X direction) and having a second pitch PS-Y in the second horizontal direction (Y direction). In the thermal region TR, the thermal bumps BMP-T may form a matrix having a third pitch PTb-X in the first horizontal direction (X direction) and having a fourth pitch PTb-Y in the second horizontal direction (Y direction).

The signal via PVA-S connected to the signal bump BMP-S may have the first horizontal width W1, and the thermal via PVA-Ta connected to the thermal bump BMP-Ta may have the third horizontal width W3. In an example embodiment, the third horizontal width W3 may have a value greater than the first horizontal width W1.

Figure 6C:
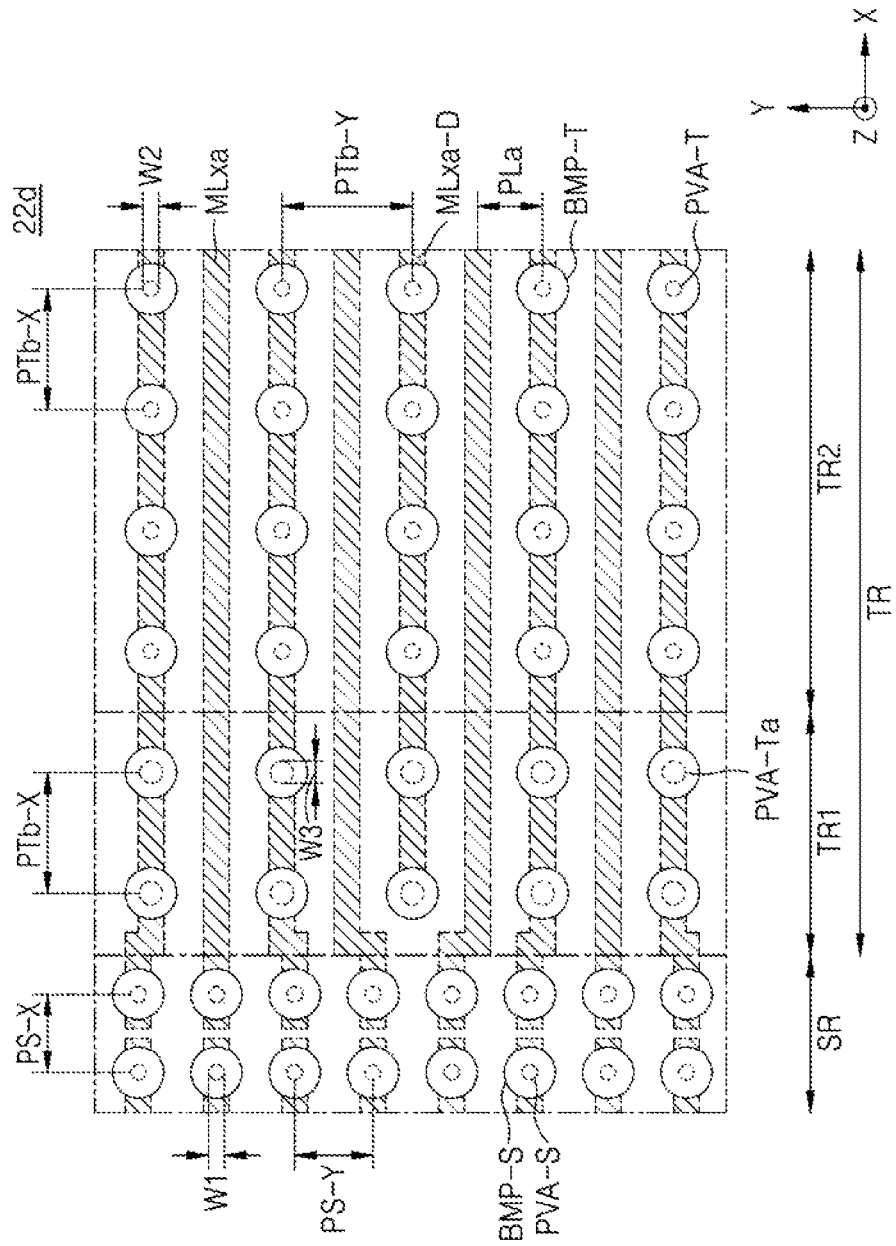

Referring to FIG. 6C, an upper semiconductor chip 22d according to an example embodiment may include the signal region SR and the thermal region TR. The thermal region TR may include a first thermal region TR1 and a second thermal region TR2. The upper semiconductor chip 22d may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the thermal region TR, the thermal bumps BMP-T may form a matrix having a third pitch PTb-X in the first horizontal direction (X direction) and having a fourth pitch PTb-Y in the second horizontal direction (Y direction).

The signal via PVA-S connected to the signal bump BMP-S may have the first horizontal width W1, the thermal via PVA-Ta connected to the thermal bump BMP-T in the first thermal region TR1 may have the third horizontal width W3, and the thermal via PVA-T connected to the thermal bump BMP-Ta in the second thermal region TR2 may have the second horizontal width W2. In an example embodiment, the third horizontal width W3 may have a value greater than that of the first horizontal width W1, and the second horizontal width W2 may have a value smaller than that of the third horizontal width W3. In an example embodiment, the first horizontal width W1 and the second horizontal width W2 may have the same value.

Figure 6D:
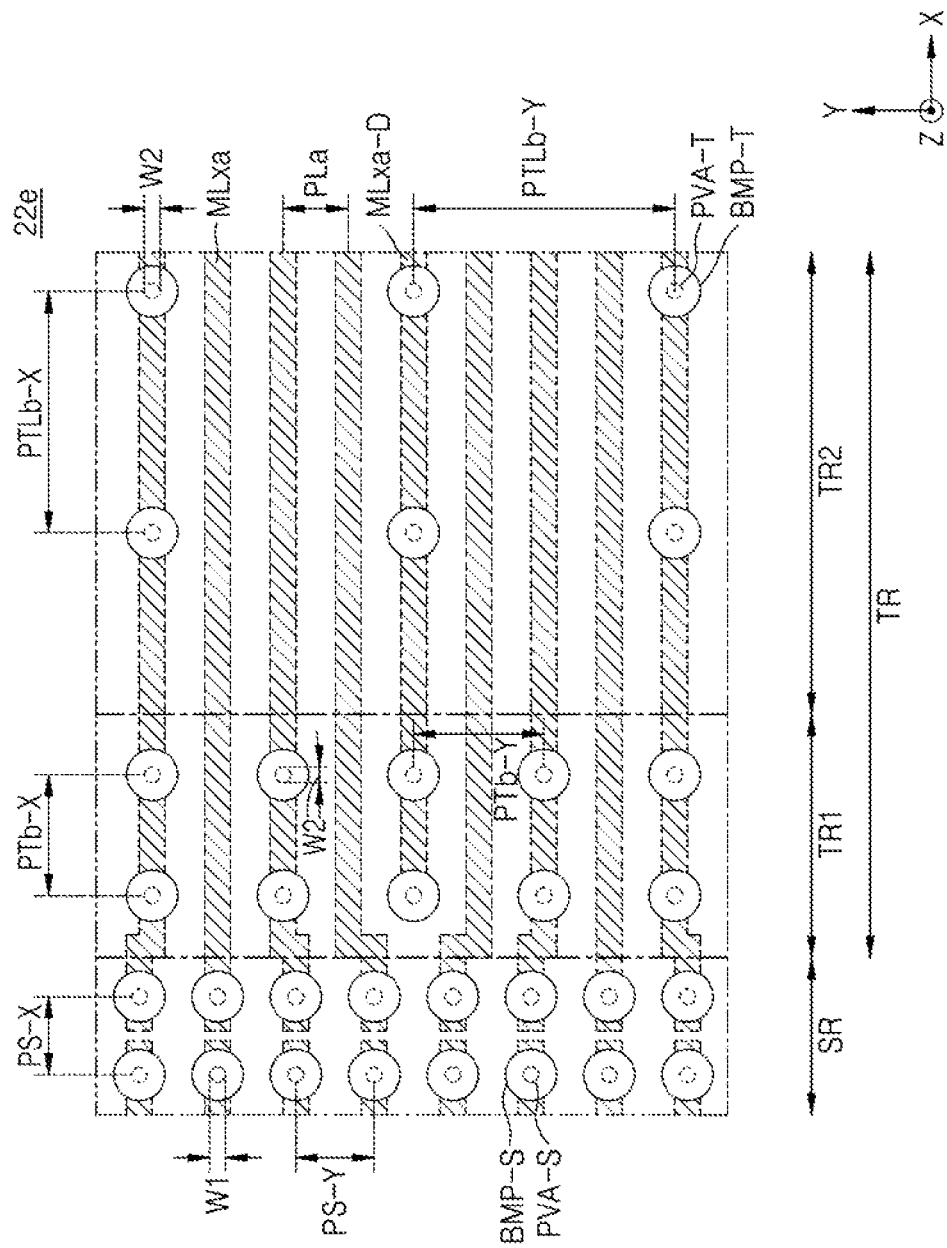

Referring to FIG. 6D, an upper semiconductor chip 22e according to an example embodiment may include the signal region SR and the thermal region TR. The thermal region TR may include a first thermal region TR1 and a second thermal region TR2. The upper semiconductor chip 22e may be the second semiconductor chip 200 shown in FIG. 1.

In the signal region SR, the signal bumps BMP-S may form a matrix having a first pitch PS-X in the first horizontal direction (X direction) and having a second pitch PS-Y in the second horizontal direction (Y direction). In the first thermal region TR1, the thermal bumps BMP-T may form a matrix having the third pitch PTb-X in the first horizontal direction (X direction) and having the fourth pitch PTb-Y in the second horizontal direction (Y direction). In the second thermal region TR2, the thermal bumps BMP-T may form a matrix having a fifth pitch PTLb-X in the first horizontal direction (X direction) and having a sixth pitch PTLb-Y in the second horizontal direction (Y direction).

The fifth pitch PTLb-X may have a greater value than the third pitch PTb-X, and the sixth pitch PTLb-Y may have a greater value than the fourth pitch PTb-Y. In an example embodiment, the fifth pitch PTLb-X may be an 2, 3, or greater integer multiple of the third pitch PTb-X, and the sixth pitch PTLb-Y may be an integer multiple of 2 or 3 times greater than the fourth pitch PTb-Y. In an example embodiment, the third pitch PTb-X may be an 2, 3, or greater integer multiple of the wiring pitch PLa, or the fourth pitch PTb-Y may be an integer multiple of 2 or 3 times greater than the wiring pitch PLa.

The signal via PVA-S connected to the signal bump BMP-S may have the first horizontal width W1, and the thermal via PVA-T connected to the thermal bump BMP-T may have the second horizontal width W2.

Although the dummy wiring pattern MLxa-D is shown only in the semiconductor chips 20d, 20e, 22d, and 22e shown in FIGS. 6A to 6D, the semiconductor chips 20, 20a, 22, 22a, 20b, 20c, 22b, and 22c shown in FIGS. 4A to 5D may further include dummy wiring patterns located at the same vertical level as the topmost wiring pattern MLx.

Figure 7:
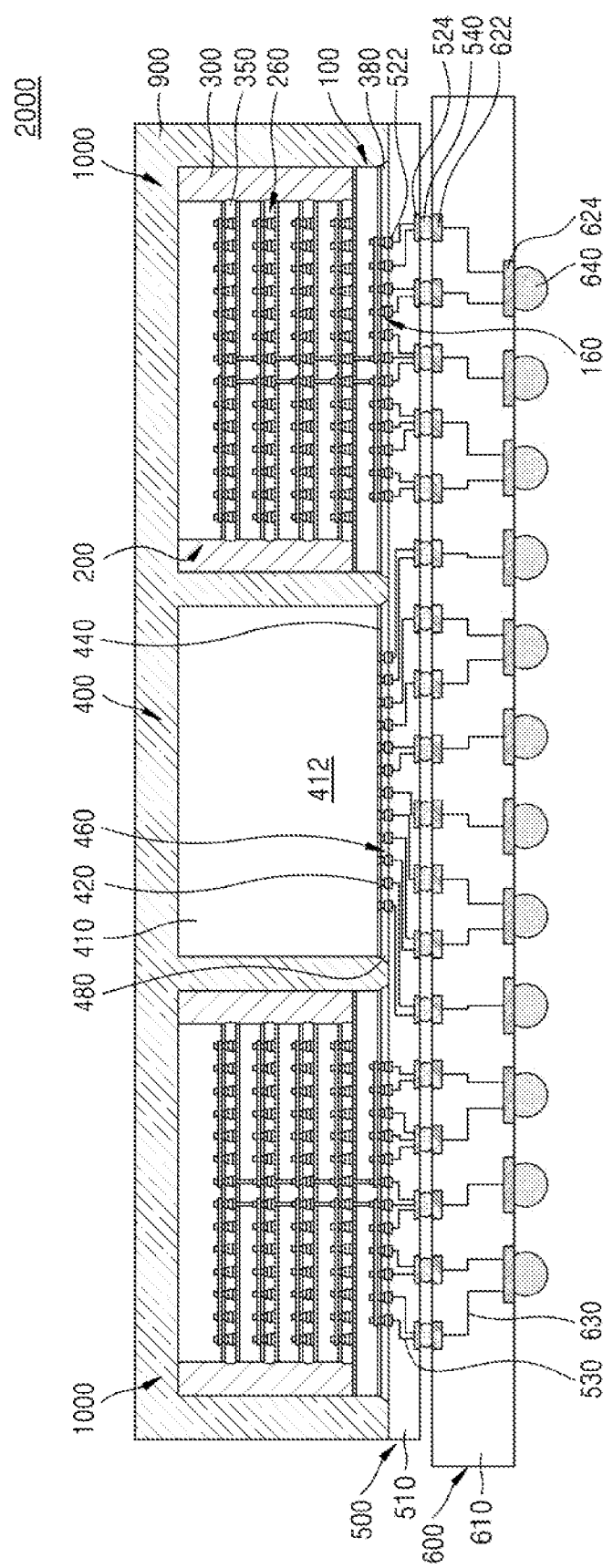
FIG. 7 is a cross-sectional view of a semiconductor package according to an example embodiment.

FIG. 7 is a cross-sectional view of a semiconductor package according to an example embodiment.

Referring to FIG. 7, a semiconductor package 2000 according to an example embodiment may include a main board 600 having mounted thereon an interposer 500, a sub-semiconductor package 1000 (which is attached to the interposer 500 and includes the first semiconductor chip 100 and the second semiconductor chips 200), and a third semiconductor chip 400. The sub-semiconductor package 1000 may be the semiconductor package 1000 shown in FIG. 1, and the sub-semiconductor package 1000 will be described below with reference to FIG. 1 together. Also, the semiconductor package 2000 may be referred to as a system.

The sub-semiconductor package 1000 may be attached to the interposer 500 through a plurality of first connecting bumps 160. Because the first connecting bumps 160 are similar to the second connecting bumps 260, detailed descriptions thereof will be omitted. The first connecting bumps 160 may be electrically connected to the first wiring structure 120 of the first semiconductor chip 100. The first connecting bumps 160 may provide at least one of a signal, power, and ground for the sub-semiconductor package 1000. In an example embodiment, similarly as the signal bumps 260S shown in FIG. 1, each of the first connecting bumps 160 may provide at least one of a signal, power, and ground for the sub-semiconductor package 1000, and may not perform only the function for heat dissipation like the thermal bumps 260T shown in FIG. 1.

Although FIG. 7 shows that the semiconductor package 2000 includes two sub-semiconductor packages 1000, the semiconductor package 2000 may include one sub-semiconductor package 1000, or three or more sub-semiconductor packages 1000.

The third semiconductor chip 400 may include a third semiconductor substrate 410 having a third semiconductor device 412 on an active surface, a plurality of top surface connecting pads 420, a third front surface protecting layer 440, and a plurality of third connecting bumps 460 attached to the top surface connecting pads 420. The third semiconductor chip 400 may be, e.g., a central processing unit (CPU) chip, a graphics processing unit (GPU) chip, or an application processor (AP) chip.

The third semiconductor substrate 410 may be a component similar to the first semiconductor substrate 110 or the second semiconductor substrate 210 shown in FIG. 1, the third semiconductor device 412 may be a component similar to the first semiconductor device 112 or the second semiconductor device 212 shown in FIG. 1, the third front surface protecting layer 440 may be a component similar to the first front surface protecting layer 140 or the second front surface protecting layer 240 shown in FIG. 1, and the third connecting bumps 460 may be components similar to the first connecting bumps 160 or the second connecting bumps 260 shown in FIG. 1, and thus detailed descriptions thereof will be omitted. In an example embodiment, the top surface connecting pads 420 may each include at least one of aluminum, copper, and nickel.

The interposer 500 may include a base layer 510, a first top surface pad 522 and a first bottom surface pad 524 respectively arranged on the top surface and the bottom surface of the base layer 510, and a first wiring path 530 penetrating through the base layer 510 and electrically connecting the first top surface pad 522 and the first bottom surface pad 524.

The base layer 510 may include a semiconductor, glass, ceramic, or plastic. For example, the base layer 510 may include silicon. The first wiring path 530 may be a wiring layer connected to the first top surface pad 522 and/or the first bottom surface pad 524 on the top surface and/or the bottom surface of the base layer 510 and/or an inner via electrode electrically connecting the first top surface pad 522 and the first bottom surface pad 524 to the interior of the base layer 510. The first connecting bump 160 electrically connecting the sub-semiconductor package 1000 and the interposer 500, and the third connecting bump 460 electrically connecting the third semiconductor chip 400 and the interposer 500, may be connected to the first top surface pad 522.

A first underfill layer 380 may be between the sub-semiconductor package 1000 and the interposer 500, and a second underfill layer 480 may be between the third semiconductor chip 400 and the interposer 500. The first underfill layer 380 and the second underfill layer 480 may surround the first connecting bump 160 and the third connecting bump 460, respectively.

The semiconductor package 2000 may further include a package molding layer 900 surrounding side surfaces of the sub-semiconductor package 1000 and side surfaces of the third semiconductor chip 400 on the interposer 500. The package molding layer 900 may include, e.g., an EMC. In an example embodiment, the package molding layer 900 may cover the top surfaces of the sub-semiconductor package 1000 and the third semiconductor chip 400. In another example embodiment, the package molding layer 900 may not cover the top surfaces of the sub-semiconductor package 1000 and the third semiconductor chip 400. For example, a heat dissipation member may be attached onto the sub-semiconductor package 1000 and the third semiconductor chip 400 with a thermal interface material (TIM) layer therebetween. The TIM layer may be, e.g., mineral oil, grease, gap filler putty, phase change gel, phase change material pads, or a powder filled epoxy. The heat dissipation member may be, e.g., a heat sink, a heat spreader, a heat pipe, or a liquid cooled cold plate.

A board connecting terminal 540 may be attached onto the first bottom surface pad 524. The board connecting terminal 540 may electrically connect the interposer 500 and the main board 600.

The main board 600 may include a base board layer 610, a second top surface pad 622 and a second bottom surface pad 624 respectively arranged on the top surface and the bottom surface of the base board layer 610, and a second wiring path 630 penetrating through the base board layer 610 and electrically connecting the second top surface pad 622 and the second bottom surface pad 624.

In an example embodiment, the main board 600 may be a printed circuit board. For example, the main board 600 may be a multi-layer printed circuit board. The base board layer 610 may include at least one material selected from among phenol resin, epoxy resin, and polyimide.

Solder resist layers (not shown) exposing the second top surface pad 622 and the second bottom surface pad 624 may be formed on top surface and the bottom surface of the base board layer 610, respectively. The board connecting terminal 540 may be connected to the second top surface pad 622, and an outside connecting terminal 640 may be connected to the second bottom surface pad 624. The board connecting terminal 540 may electrically connect between the first bottom surface pad 524 and the second top surface pad 622. The outside connecting terminal 640 connected to the second bottom surface pad 624 may connect the semiconductor package 2000 to the outside.

In an example embodiment, the semiconductor package 2000 may not include the main board 600, and the board connecting terminal 540 of the interposer 500 may function as an outside connecting terminal.

As described above, embodiments relate to a semiconductor package having stacked semiconductor chips. Embodiments may provide a semiconductor package having stacked semiconductor chips with improved reliability and operational stability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a lower semiconductor chip including a lower semiconductor substrate, a rear surface protecting layer covering a non-active surface of the lower semiconductor substrate, a plurality of lower via electrodes penetrating through the lower semiconductor substrate and the rear surface protecting layer, and a plurality of rear surface signal pads and a plurality of rear surface thermal pads arranged on the rear surface protecting layer;
    an upper semiconductor chip including an upper semiconductor substrate, a wiring structure on an active surface of the upper semiconductor substrate, a front surface protecting layer that covers the wiring structure and has a plurality of front surface openings, and a plurality of signal vias and a plurality of thermal vias that fill the plurality of front surface openings, wherein both the plurality of signal vias and the plurality of thermal vias are electrically connected to the wiring structure; and
    a plurality of signal bumps connecting between the plurality of rear surface signal pads and the plurality of signal vias, and a plurality of thermal bumps connecting between the plurality of rear surface thermal pads and the plurality of thermal vias, wherein:
        the plurality of signal bumps and the plurality of thermal bumps are between the lower semiconductor chip and the upper semiconductor chip, and
        the plurality of rear surface signal pads are connected to the plurality of lower via electrodes, and entire bottom surfaces of the plurality of rear surface thermal pads are in contact with the rear surface protecting layer.

2. The semiconductor package as claimed in claim 1, wherein the upper semiconductor chip includes:
    a signal region, which is at a center of the upper semiconductor chip when viewed from above and has arranged therein the plurality of signal bumps, and
    a thermal region, which surrounds the signal region and has arranged therein the plurality of thermal bumps.

3. The semiconductor package as claimed in claim 2, wherein:
    the plurality of signal vias each have a first horizontal width, the plurality of thermal vias each have a second horizontal width,
    the plurality of signal bumps are arranged at a first pitch, and the plurality of thermal vias are arranged at a second pitch,
    the second horizontal width has a value equal to or greater than the first horizontal width, and
    the second pitch has a value equal to or greater than the first pitch.

4. The semiconductor package as claimed in claim 3, wherein:
    the first horizontal width and the second horizontal width have the same value, and
    the first pitch and the second pitch have the same value.

5. The semiconductor package as claimed in claim 3, wherein:
    the second horizontal width has a value greater than the first horizontal width, and
    the first pitch and the second pitch have the same value.

6. The semiconductor package as claimed in claim 3, wherein:
    the first horizontal width and the second horizontal width have the same value, and
    the second pitch has a value greater than the first pitch.

7. The semiconductor package as claimed in claim 3, wherein:
    the second horizontal width has a value greater than the first horizontal width, and
    the second pitch has a value greater than the first pitch.

8. The semiconductor package as claimed in claim 3, wherein:
    the plurality of signal vias each have the first horizontal width, and
    the thermal region includes:
        a first thermal region that is adjacent to the signal region, contacting a plurality of first thermal vias, which are some of the plurality of thermal vias each having the second horizontal width, and having arranged therein a plurality of first thermal bumps, which are some of the plurality of thermal bumps, at the second pitch; and
        a second thermal region that is relatively close to edges of the upper semiconductor chip as compared to the first thermal region, contacting a plurality of second thermal vias, which are others of the plurality of thermal vias each having a third horizontal width, and having arranged therein a plurality of second thermal bumps, which are the others of the plurality of thermal bumps, at a third pitch, and
    the second horizontal width and the third horizontal width have different values, or the second pitch and the third pitch have different values.

9. The semiconductor package as claimed in claim 8, wherein:

the second horizontal width and the third horizontal width have the same value, and
the third pitch has a value greater than the second pitch.

10. The semiconductor package as claimed in claim 9, wherein the third pitch is a 2, 3, or greater integer multiple of the second pitch.

11. The semiconductor package as claimed in claim 8, wherein:
the second horizontal width has a value greater than the third horizontal width, and
the second pitch and the third pitch have the same value.

12. The semiconductor package as claimed in claim 1, wherein:
the wiring structure includes a plurality of wiring patterns at different vertical levels,
the plurality of signal vias contact a plurality of topmost wiring patterns arranged farthest from the upper semiconductor substrate from among the plurality of wiring patterns, and
at least some of the plurality of thermal vias are in contact with any one of the plurality of topmost wiring patterns and are electrically connected to at least one of the plurality of signal vias.

13. The semiconductor package as claimed in claim 12, wherein:
the wiring structure includes a dummy wiring pattern that is at the same vertical level as the plurality of topmost wiring patterns and is not electrically connected to an upper via electrode and a signal via, and
others of the plurality of thermal vias are in contact with the dummy wiring pattern.

14. The semiconductor package as claimed in claim 12, wherein:
the plurality of topmost wiring patterns have a wiring pitch and extend in a horizontal direction, and
the plurality of thermal bumps are arranged at a pitch of an integer multiple of the wiring pitch.

15. A semiconductor package, comprising:
a first semiconductor chip including a first semiconductor substrate, a first wiring structure on an active surface of the first semiconductor substrate, a first front surface protecting layer covering the first wiring structure and having a plurality of first front surface openings, a first rear surface protecting layer covering a non-active surface of the first semiconductor substrate, a plurality of first via electrodes penetrating through the first semiconductor substrate and the first rear surface protecting layer, and a plurality of first signal pads and a plurality of first thermal pads arranged on the first rear surface protecting layer;
a plurality of second semiconductor chips vertically stacked on the first semiconductor chip and each including a second semiconductor substrate, a second wiring structure on an active surface of the second semiconductor substrate, a second front surface protecting layer covering the second wiring structure and having a plurality of second front surface openings, a second rear surface protecting layer covering a non-active surface of the second semiconductor substrate, a plurality of second via electrodes penetrating through the second semiconductor substrate and the second rear surface protecting layer, a plurality of signal vias and a plurality of thermal vias filling the second front surface openings, wherein both the plurality of signal vias and the plurality of thermal vias are electrically connected to the second wiring structure, and a plurality of second signal pads and a plurality of second thermal pads arranged on the second rear surface protecting layer;
a plurality of signal bumps connecting between first and second signal pads and the plurality of signal vias; and
a plurality of thermal bumps connecting between first and second thermal pads and the plurality of thermal vias, wherein:
the plurality of first signal pads are connected to the plurality of first via electrodes,
the plurality of second signal pads are connected to the plurality of second via electrodes,
entire bottom surfaces of the plurality of first thermal pads contact the first rear surface protecting layer, and
the entire bottom surfaces of the plurality of first thermal pads contact the second rear surface protecting layer.

16. The semiconductor package as claimed in claim 15, wherein, when viewed from above, the plurality of signal bumps are at a center of at least one of the plurality of second semiconductor chips, and the plurality of thermal bumps are close to edges of the at least one of the plurality of second semiconductor chips to surround the plurality of signal bumps.

17. The semiconductor package as claimed in claim 15, wherein at least some of the plurality of thermal bumps are electrically connected to at least one of the plurality of signal vias.

18. The semiconductor package as claimed in claim 17, wherein others of the plurality of thermal bumps are not electrically connected to the plurality of signal vias.

19. A semiconductor package, comprising:
a lower semiconductor chip including a lower semiconductor substrate, a rear surface protecting layer covering a non-active surface of the lower semiconductor substrate, a plurality of lower via electrodes penetrating through the lower semiconductor substrate and the rear surface protecting layer, and a plurality of rear surface signal pads and a plurality of rear surface thermal pads arranged on the rear surface protecting layer;
an upper semiconductor chip including an upper semiconductor substrate, a wiring structure on an active surface of the upper semiconductor substrate, a front surface protecting layer that covers the wiring structure and has a plurality of front surface openings, and a plurality of signal vias and a plurality of thermal vias that fill the plurality of front surface openings, wherein both the plurality of signal vias and the plurality of thermal vias are electrically connected to the wiring structure and each have a first horizontal width and a second horizontal width;
a plurality of signal bumps connecting between the plurality of rear surface signal pads and the plurality of signal vias and arranged at a first pitch; and
a plurality of thermal bumps connecting between the plurality of rear surface thermal pads and the plurality of thermal vias and arranged at a second pitch that is greater than the first pitch, wherein:
the plurality of signal bumps and the plurality of thermal bumps are between the lower semiconductor chip and the upper semiconductor chip,
the plurality of rear surface signal pads are connected to the plurality of lower via electrodes, and
the plurality of rear surface thermal pads are separated from the plurality of lower via electrodes and the lower semiconductor substrate with the rear surface protecting layer therebetween.

20. The semiconductor package as claimed in claim 19, wherein:
   the second horizontal width has a value greater than the first horizontal width,
   the second horizontal width is from about 5 μm to about 12 μm, and
   the second pitch is from about 40 μm to about 80 μm.

* * * * *